United States Patent
Petti

(10) Patent No.: US 10,453,531 B1
(45) Date of Patent: Oct. 22, 2019

(54) CONTENT ADDRESSABLE MEMORY USING THRESHOLD-ADJUSTABLE VERTICAL TRANSISTORS AND METHODS OF FORMING THE SAME

(71) Applicant: SANDISK TECHNOLOGIES LLC, Addison, TX (US)

(72) Inventor: Christopher J. Petti, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/022,960

(22) Filed: Jun. 29, 2018

(51) Int. Cl.
*G11C 15/04* (2006.01)
*H01L 27/24* (2006.01)
*G11C 7/14* (2006.01)

(52) U.S. Cl.
CPC .............. *G11C 15/046* (2013.01); *G11C 7/14* (2013.01); *H01L 27/2454* (2013.01)

(58) Field of Classification Search
None
See application file for complete search history.

(56) References Cited

U.S. PATENT DOCUMENTS

| | | |
|---|---|---|
| 9,595,530 B1 | 3/2017 | Zhou |
| 2010/0244122 A1 | 9/2010 | Forbes et al. |
| 2010/0295136 A1* | 11/2010 | Or-Bach ........... H01L 21/76254 257/390 |
| 2012/0313068 A1 | 12/2012 | Sakotsubo |
| 2014/0048761 A1 | 2/2014 | Nojiri et al. |
| 2014/0203237 A1 | 7/2014 | Chien et al. |

OTHER PUBLICATIONS

U.S. Appl. No. 16/022,952, filed Jun. 29, 2018.
International Search Report and Written Opinion dated May 22, 2019 in International Patent Application No. PCT/US2019/017079.

* cited by examiner

*Primary Examiner* — James G Norman
(74) *Attorney, Agent, or Firm* — Vierra Magen Marcus LLP

(57) ABSTRACT

A content addressable memory element is provided that includes a vertical transistor including a first electrode coupled to a match line, a second electrode coupled to a ground line, a first gate electrode coupled to a search line, and a second gate electrode coupled to a complementary search line. The first gate electrode and the second gate electrode are disposed on opposite sides of the vertical transistor, and the vertical transistor includes a charge storage memory element.

20 Claims, 43 Drawing Sheets

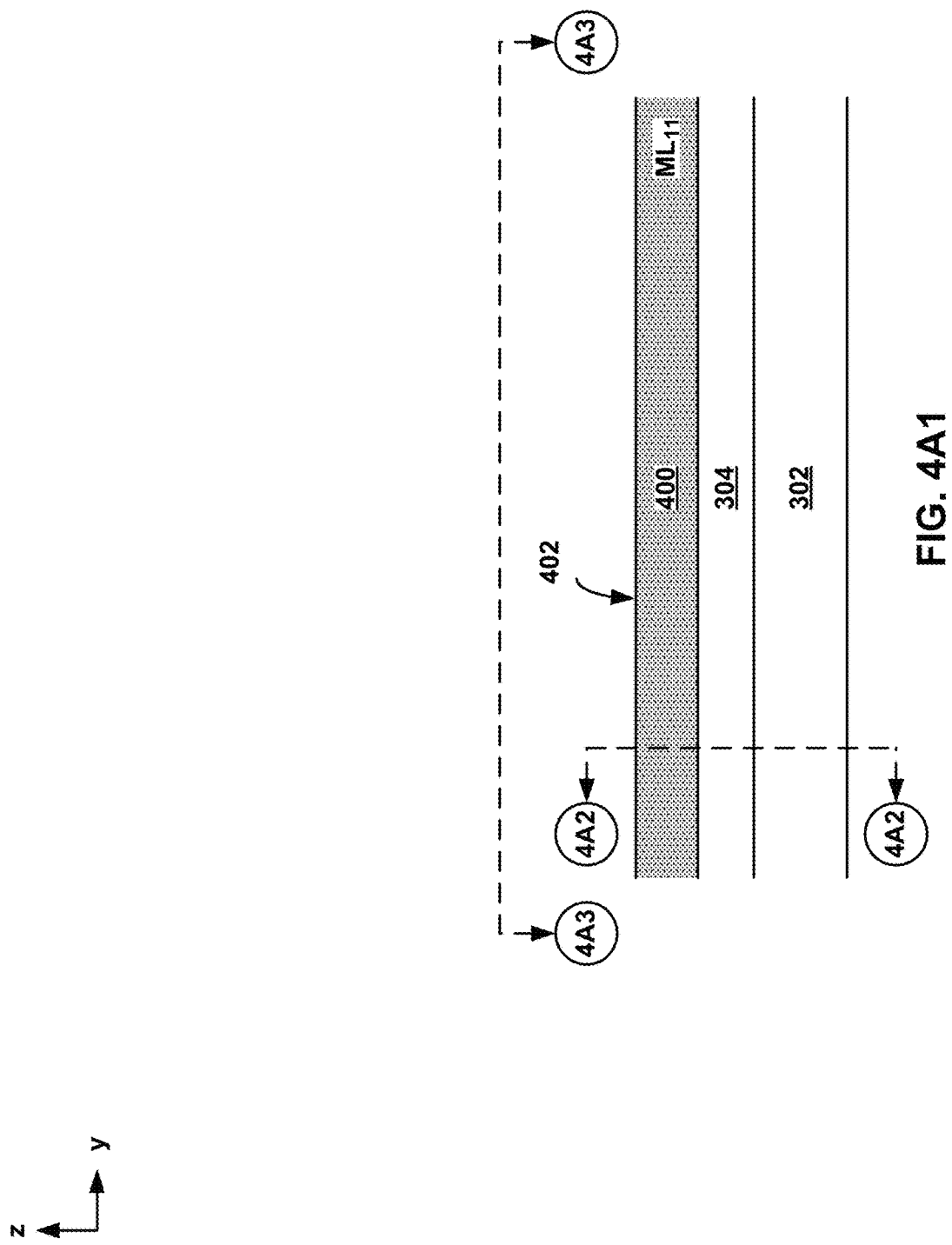

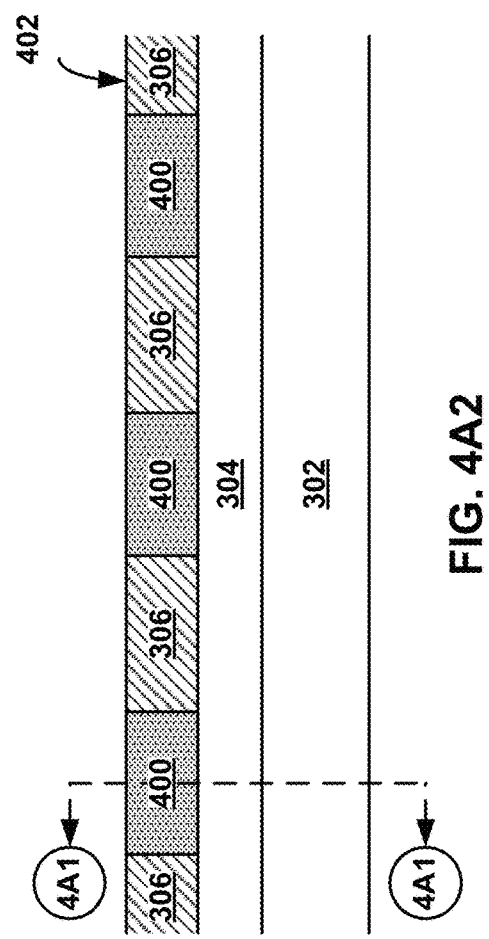
FIG. 4A2

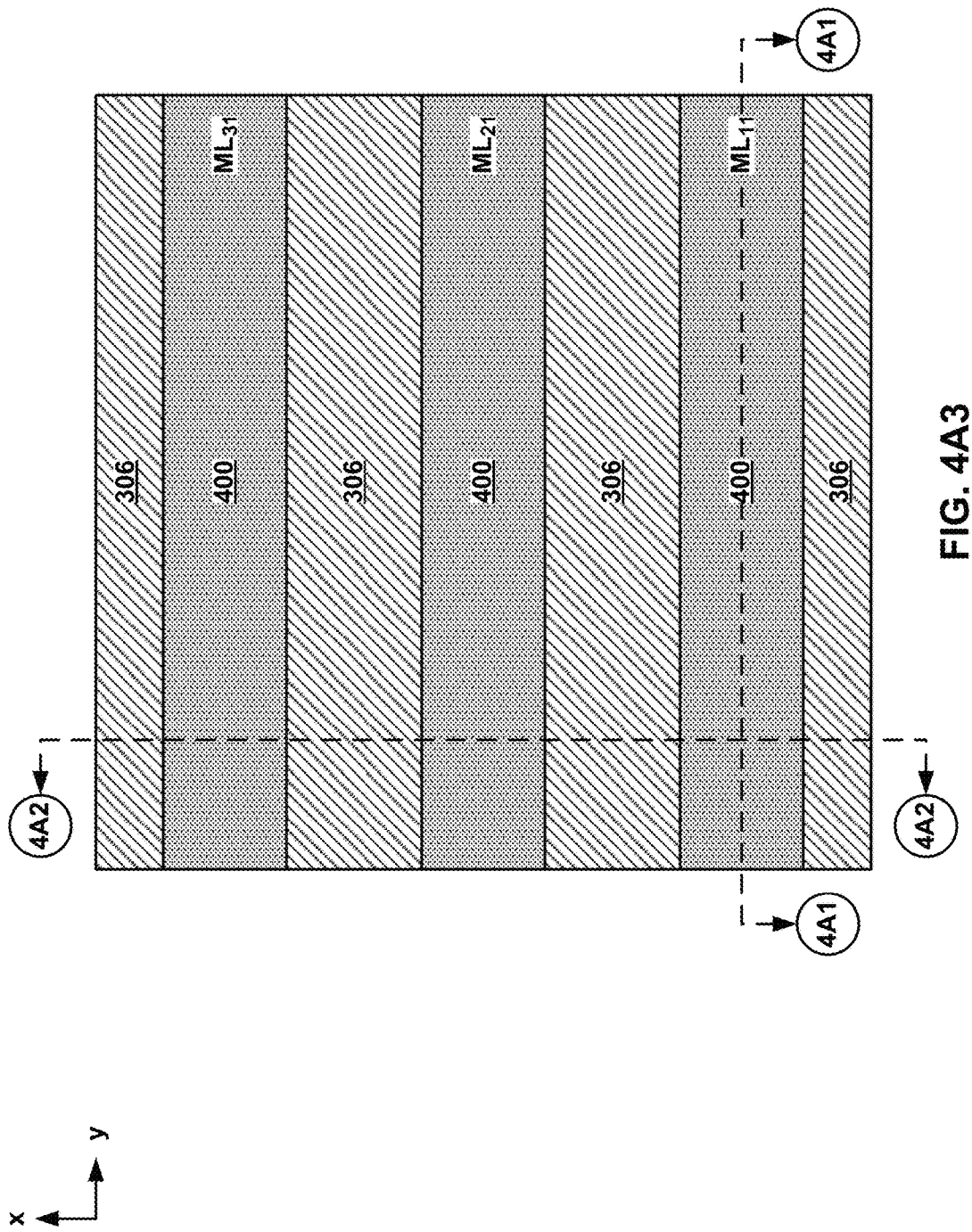
FIG. 4A3

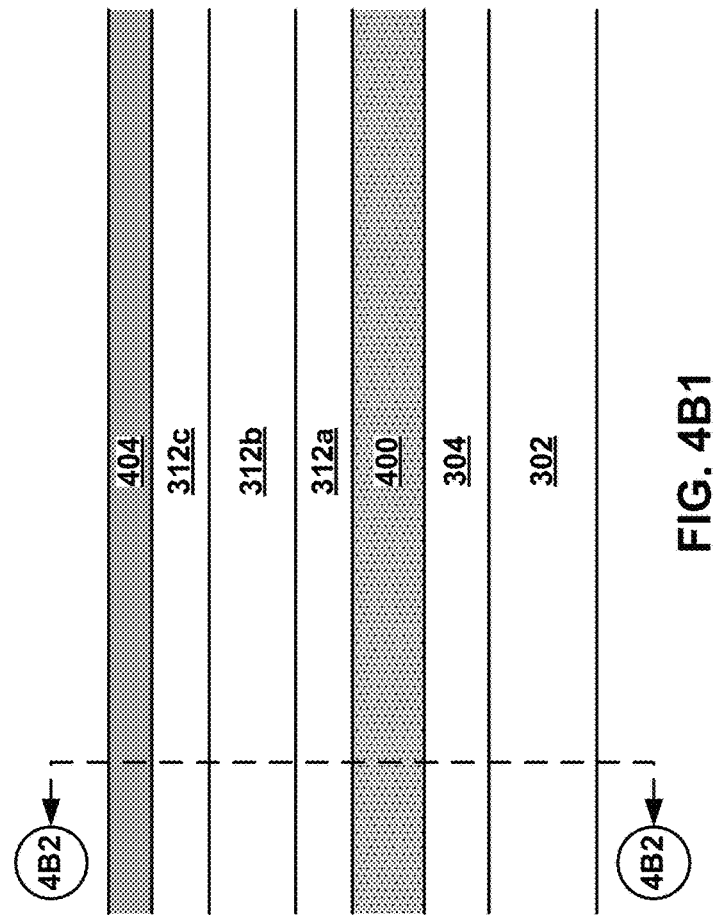
FIG. 4B1
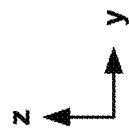

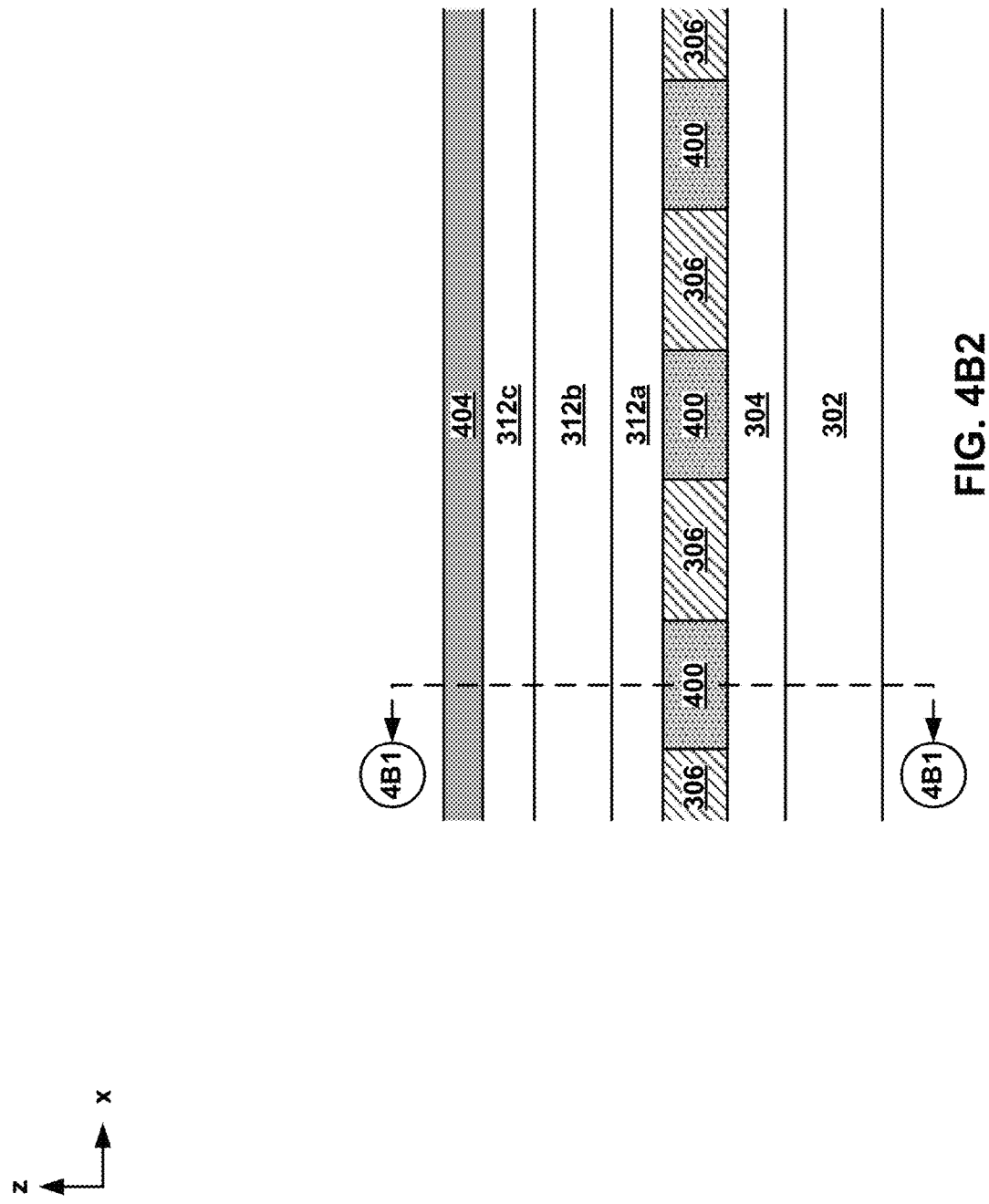

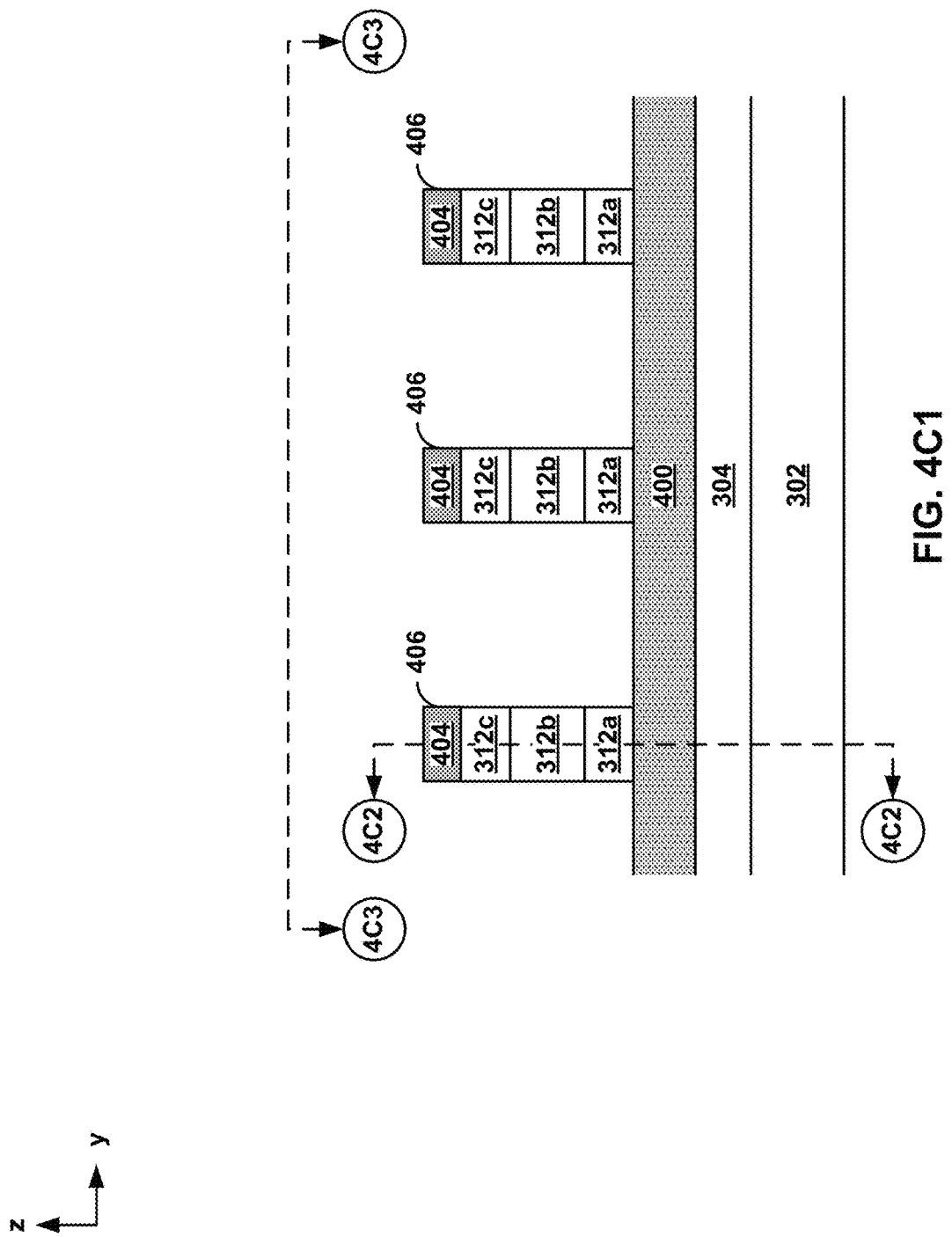

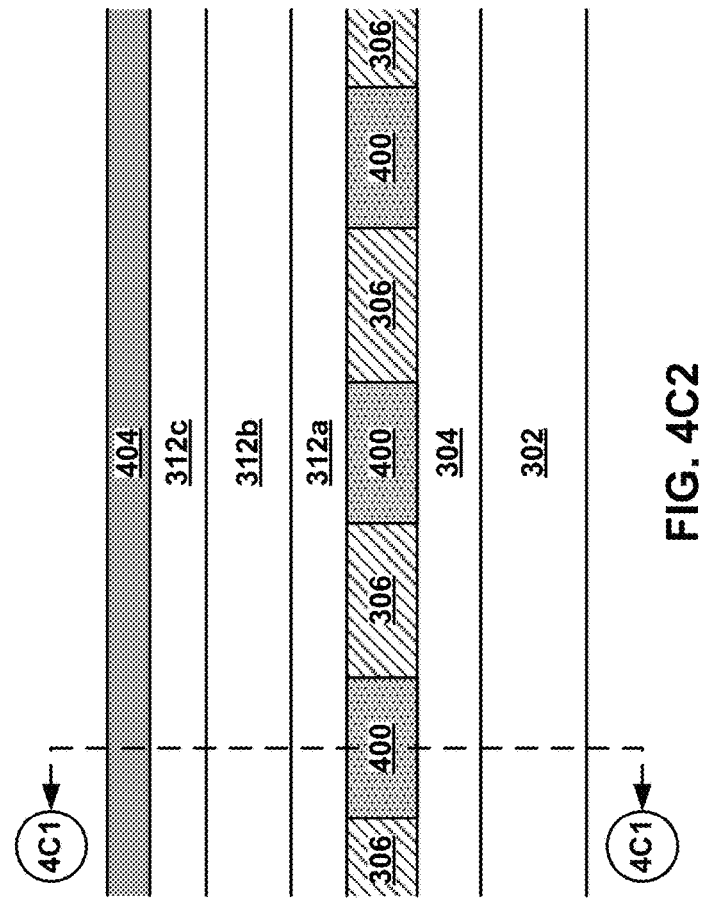
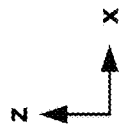
FIG. 4C2

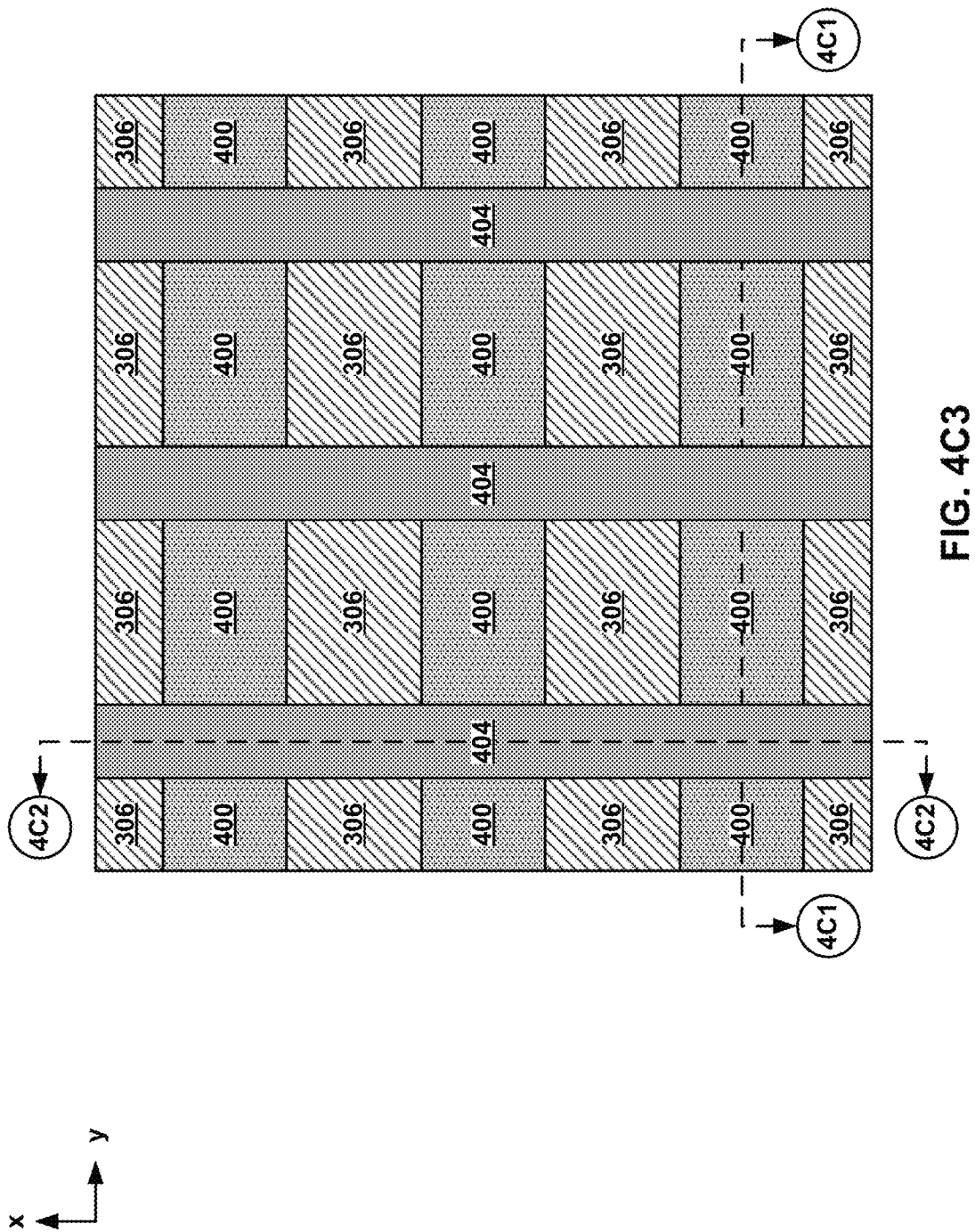
FIG. 4C3

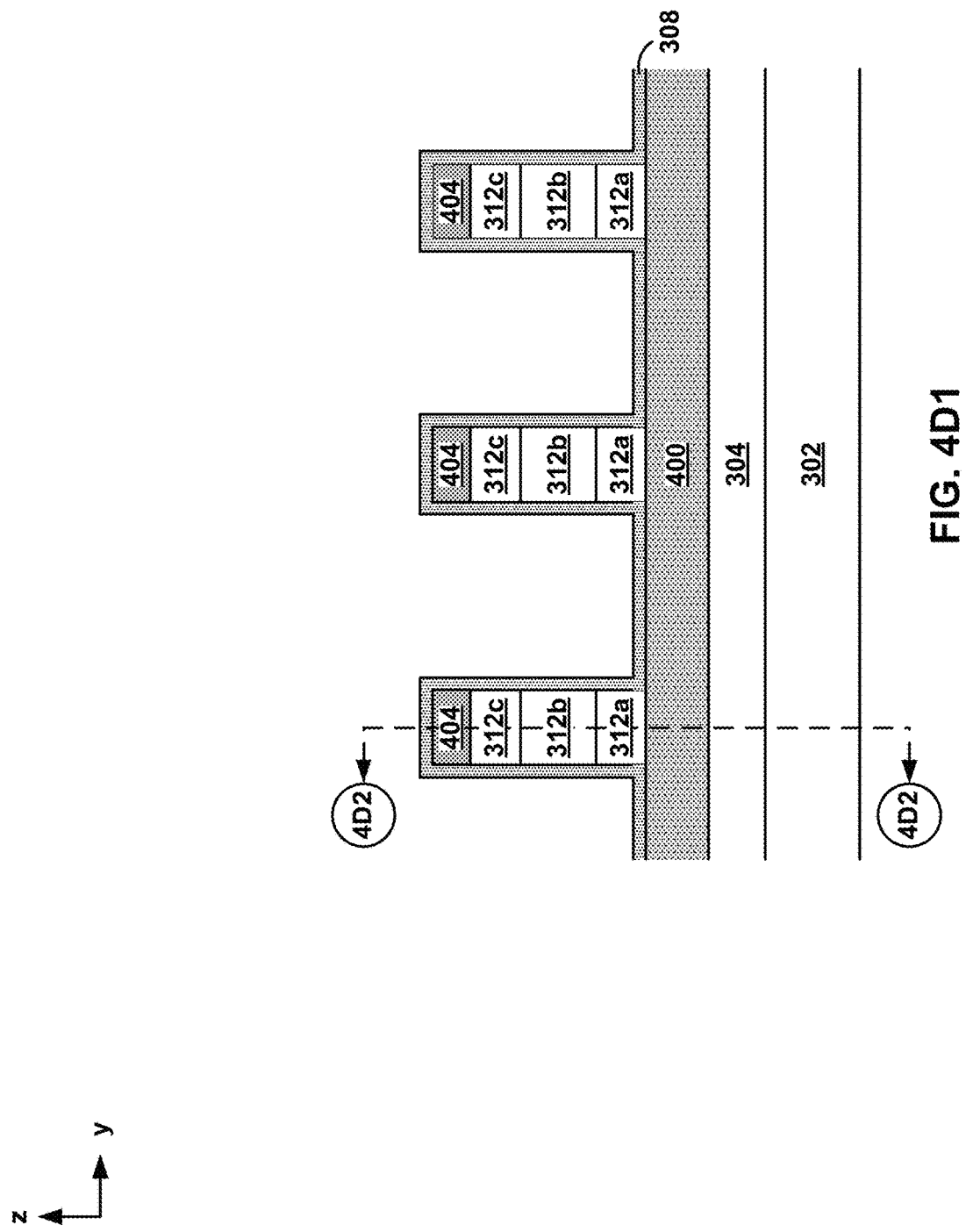

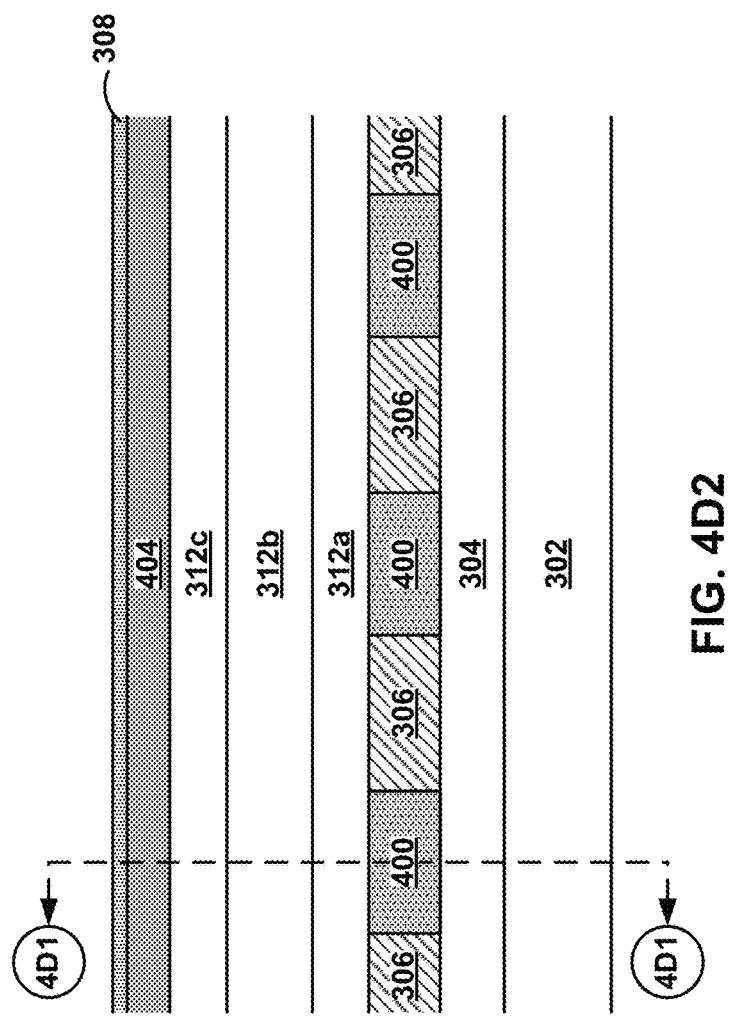
FIG. 4D2

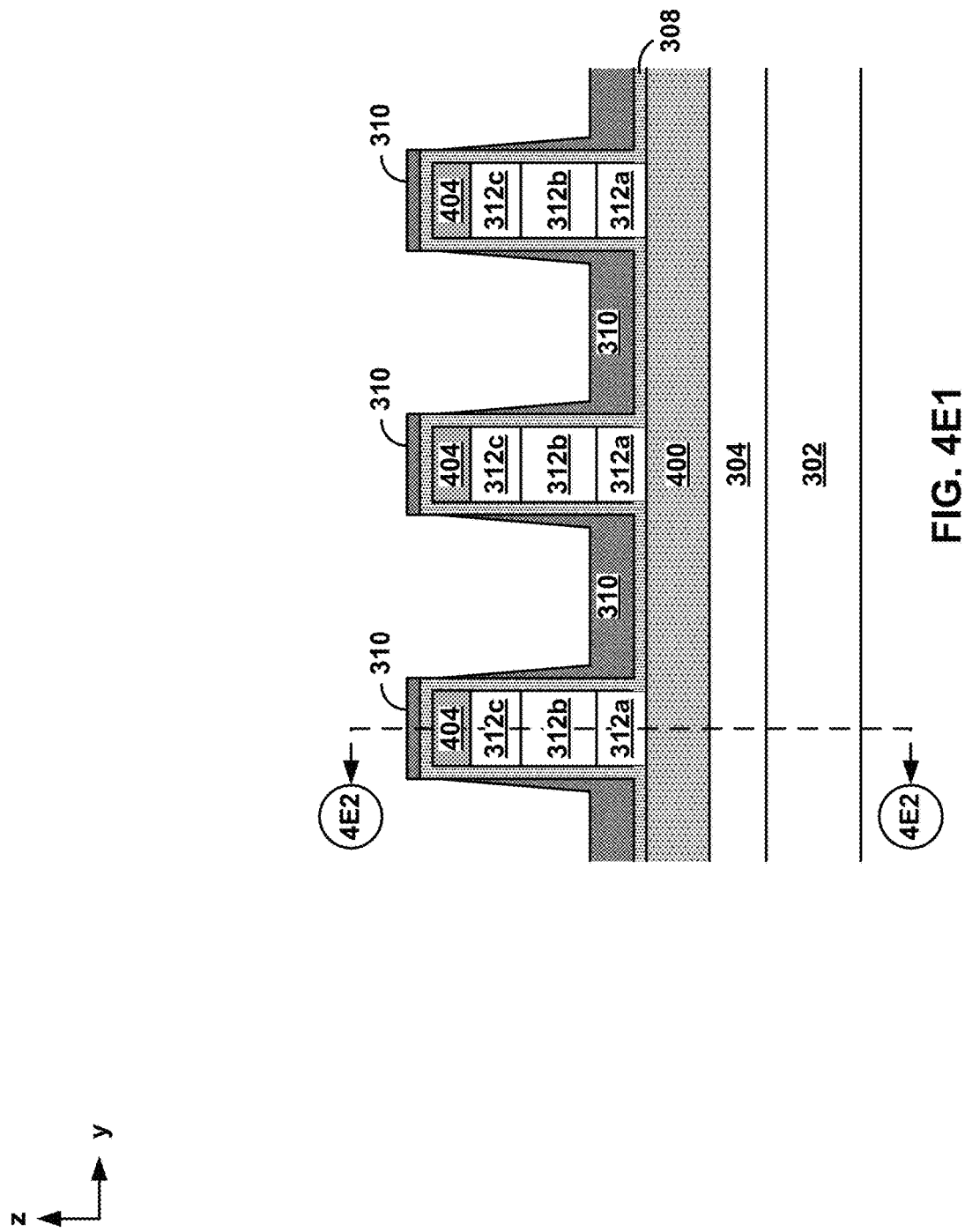

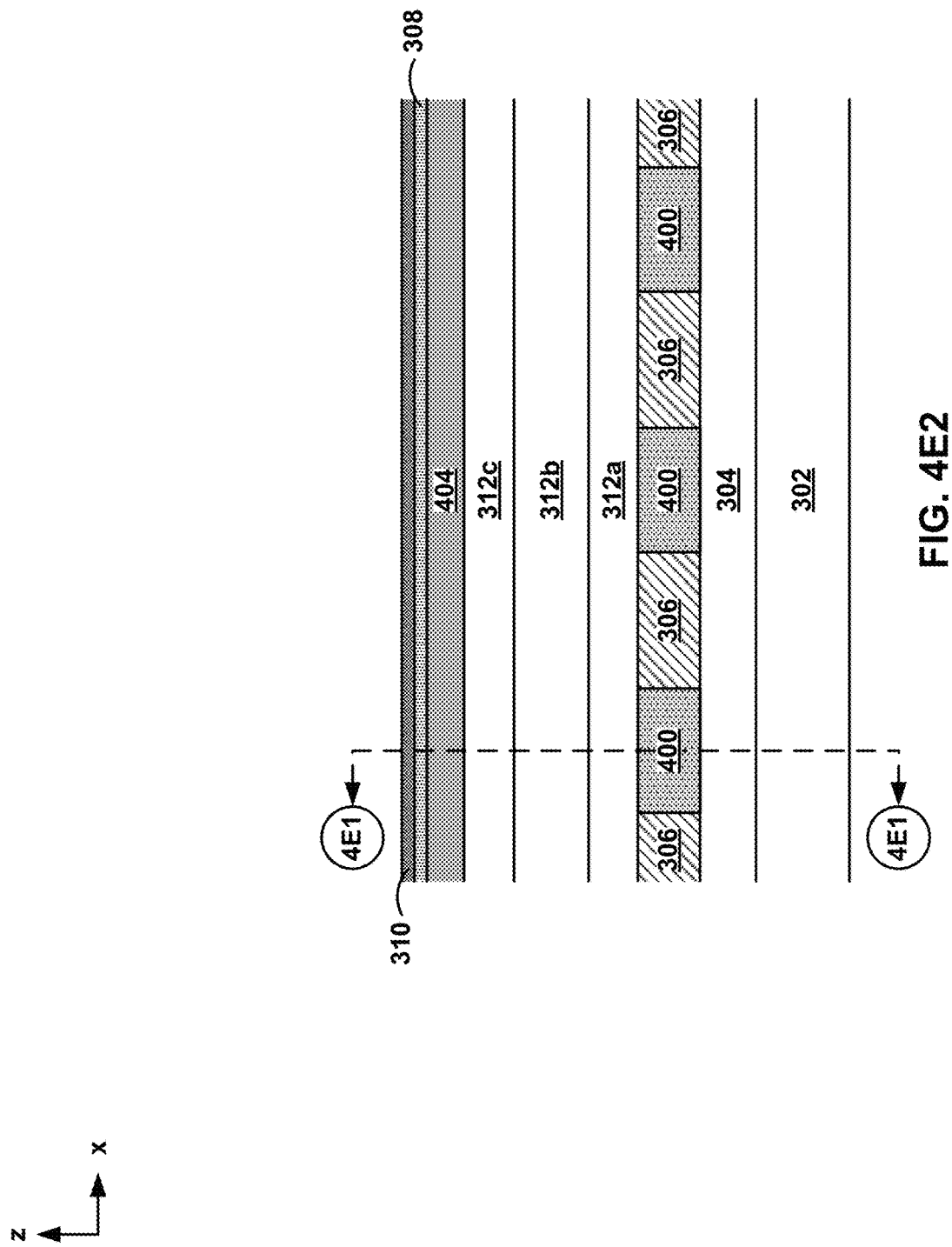

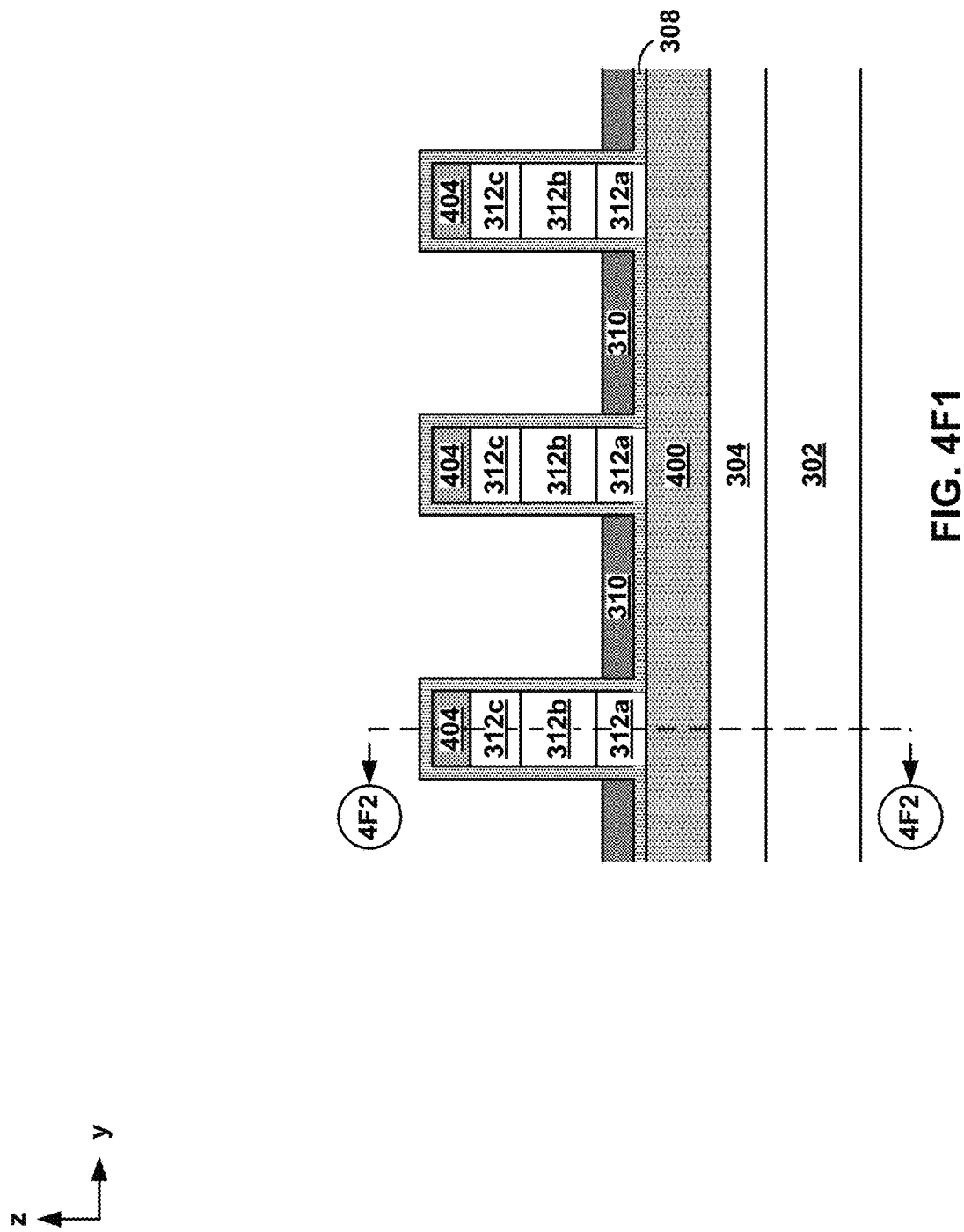

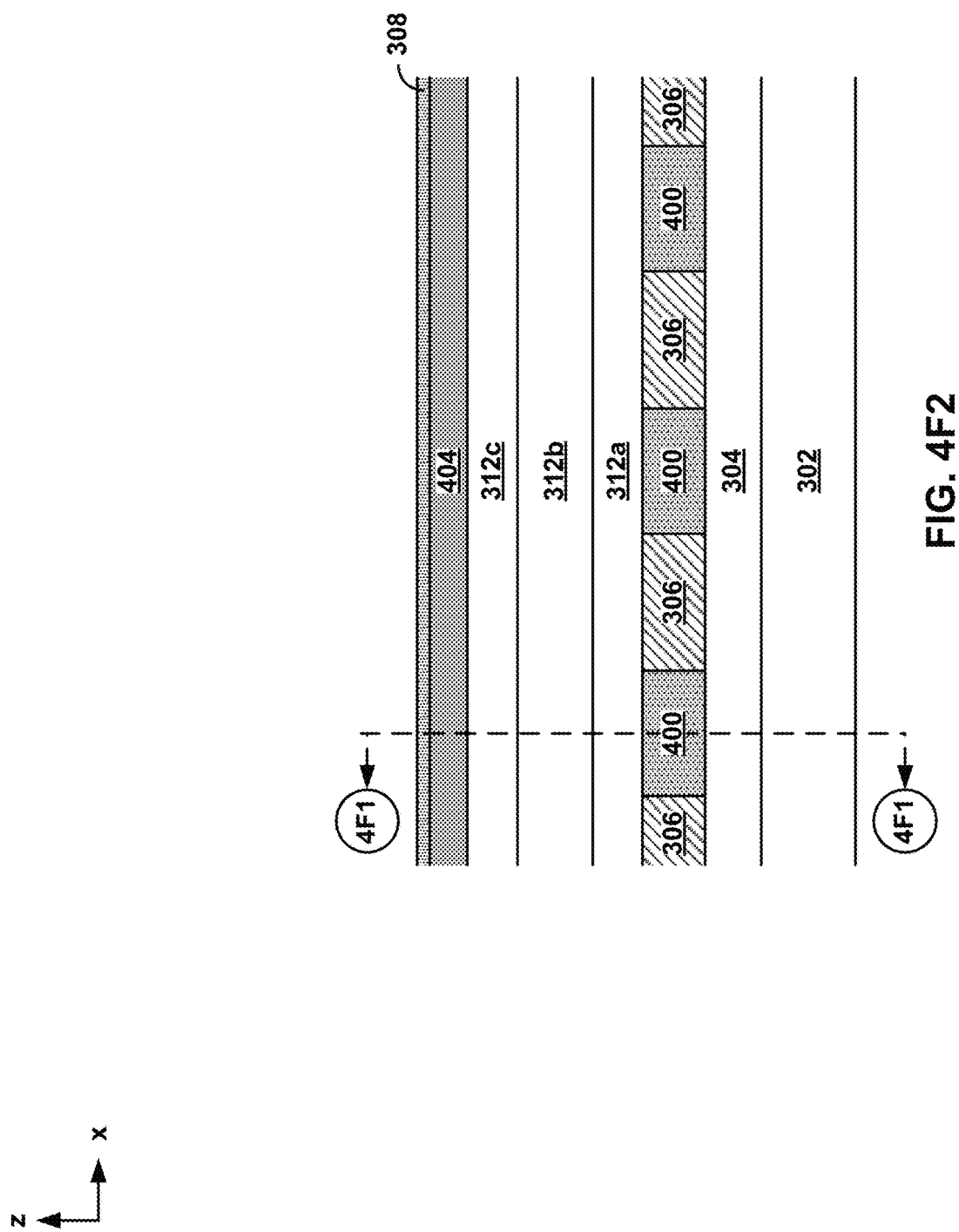
FIG. 4F2

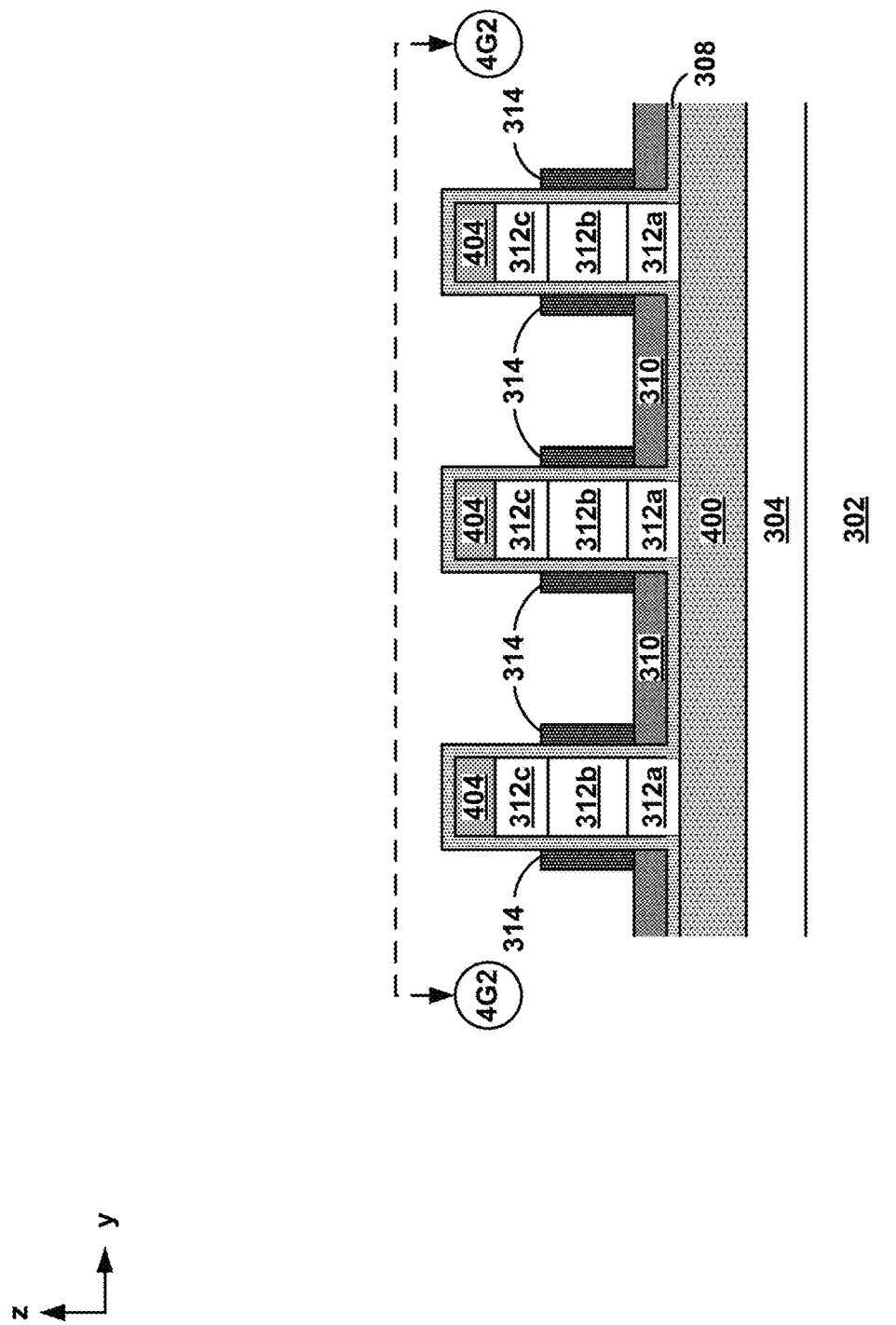
FIG. 4G1

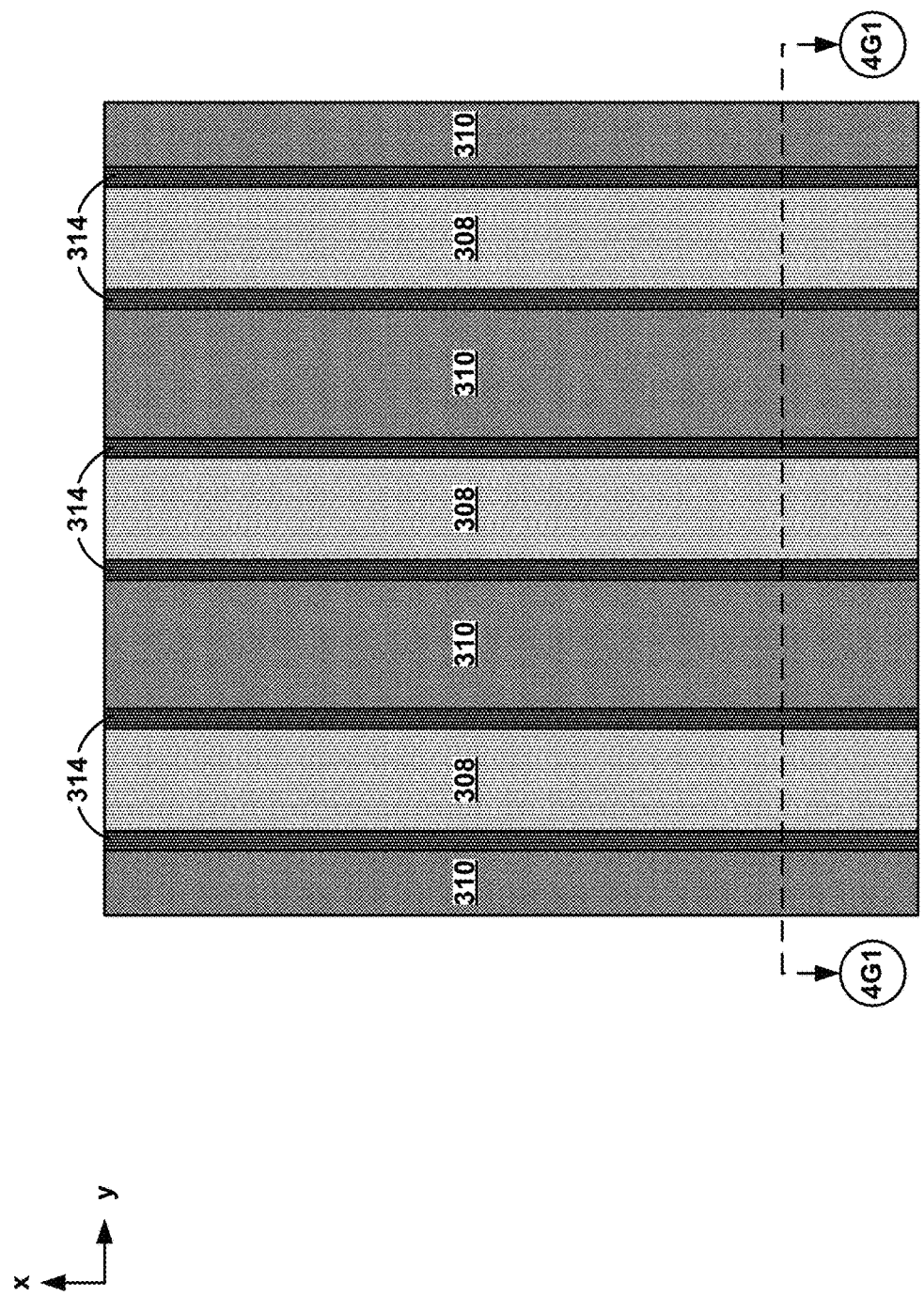
FIG. 4G2

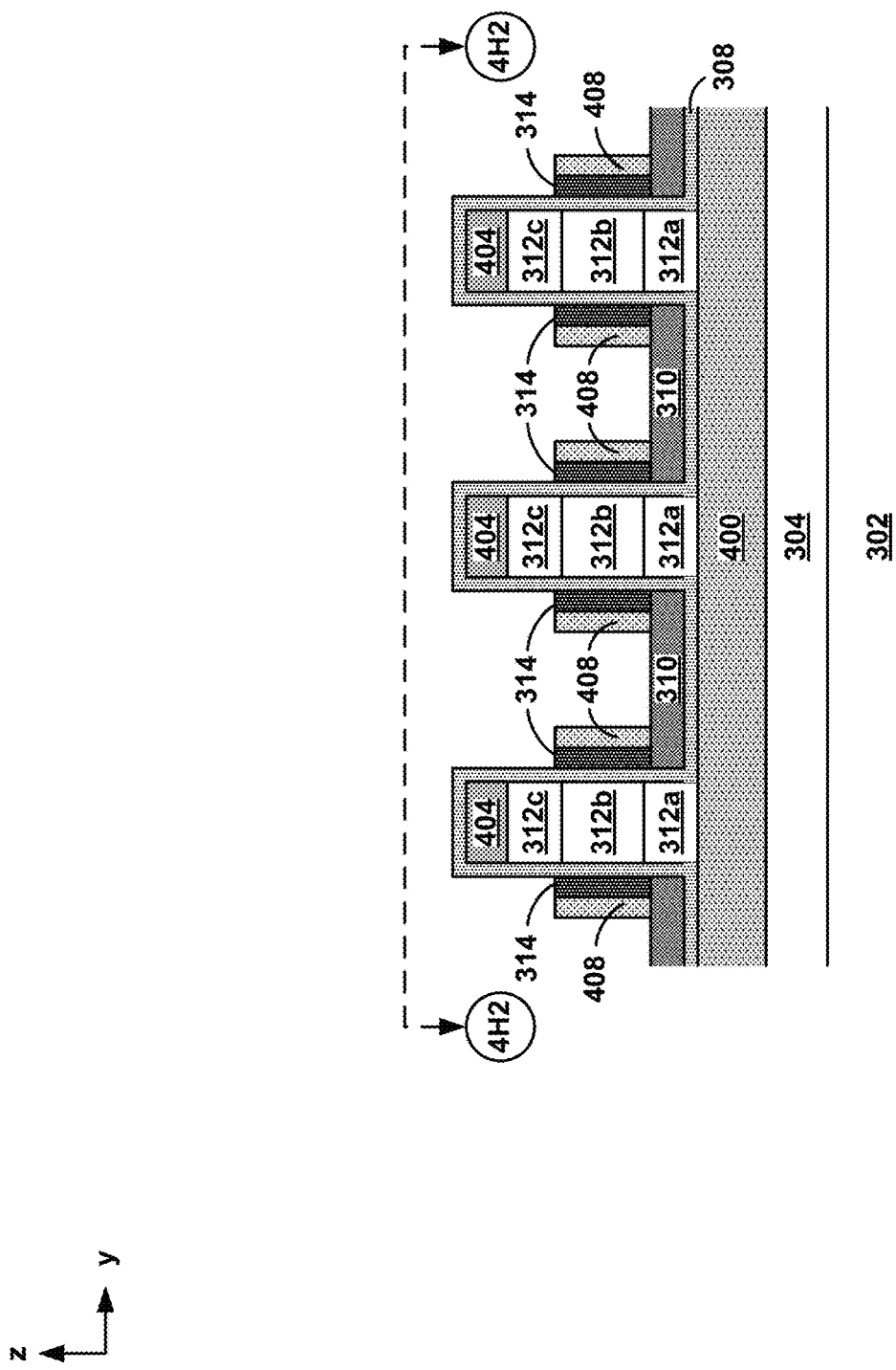
FIG. 4H1

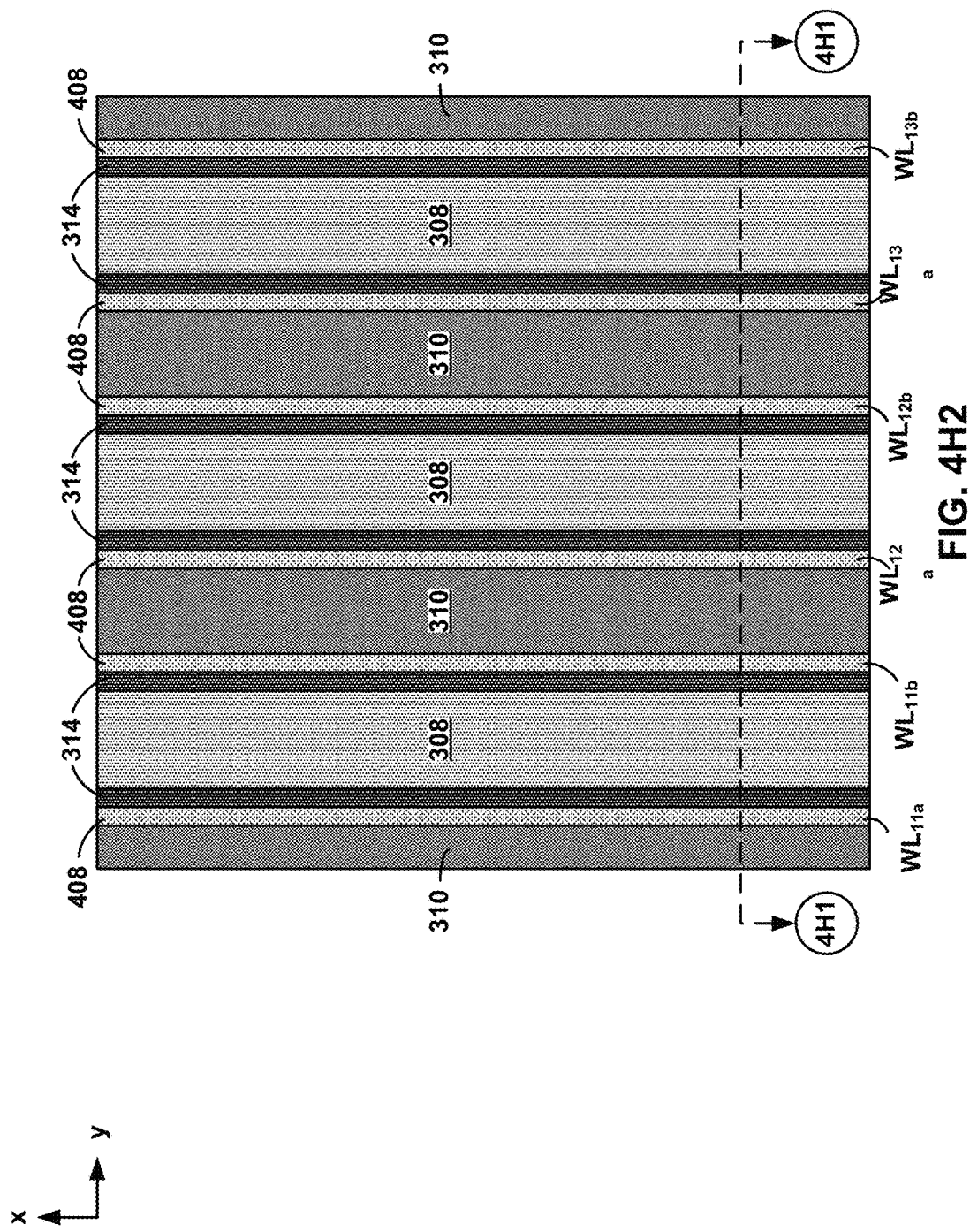
FIG. 4H2

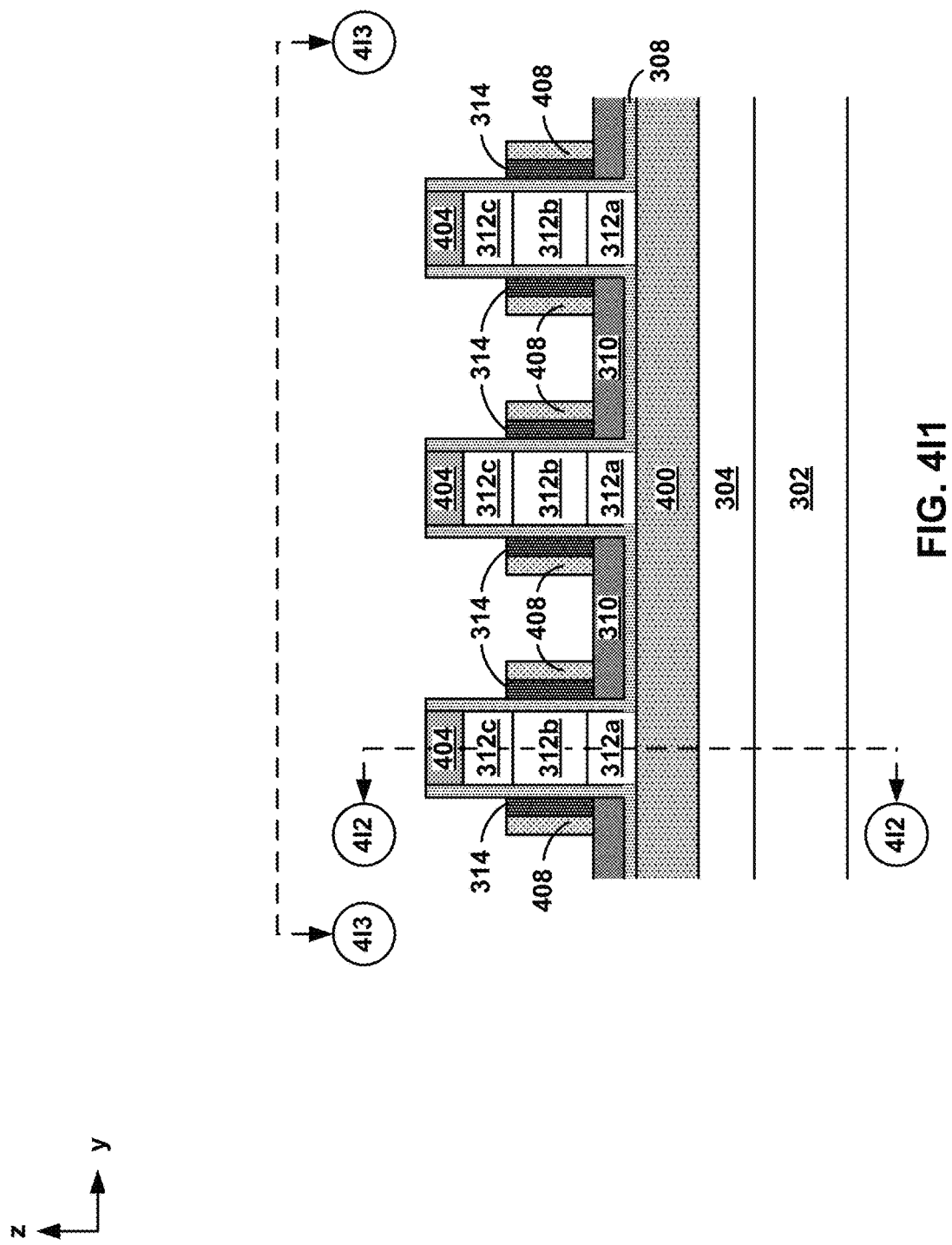
FIG. 4I1

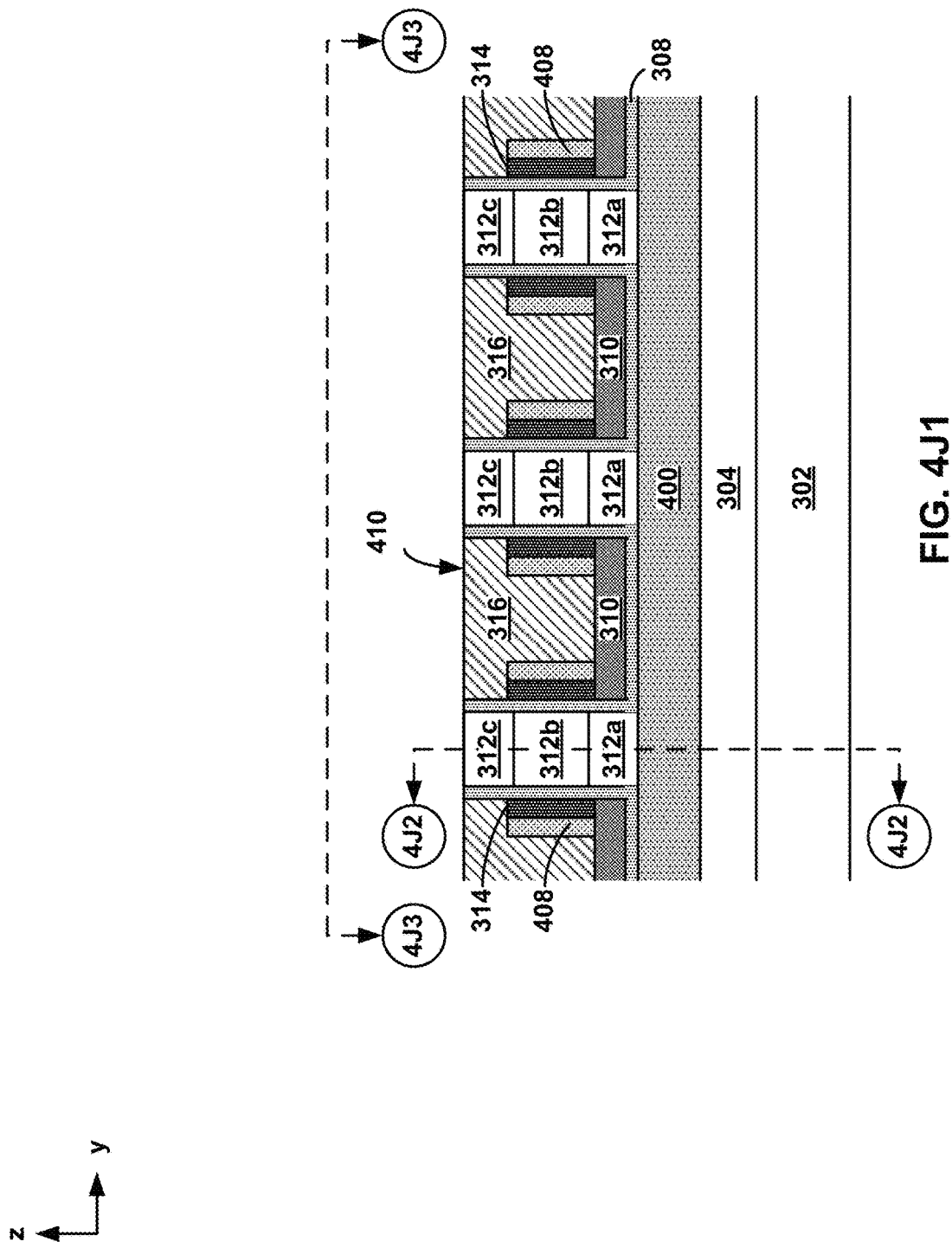
FIG. 4J1

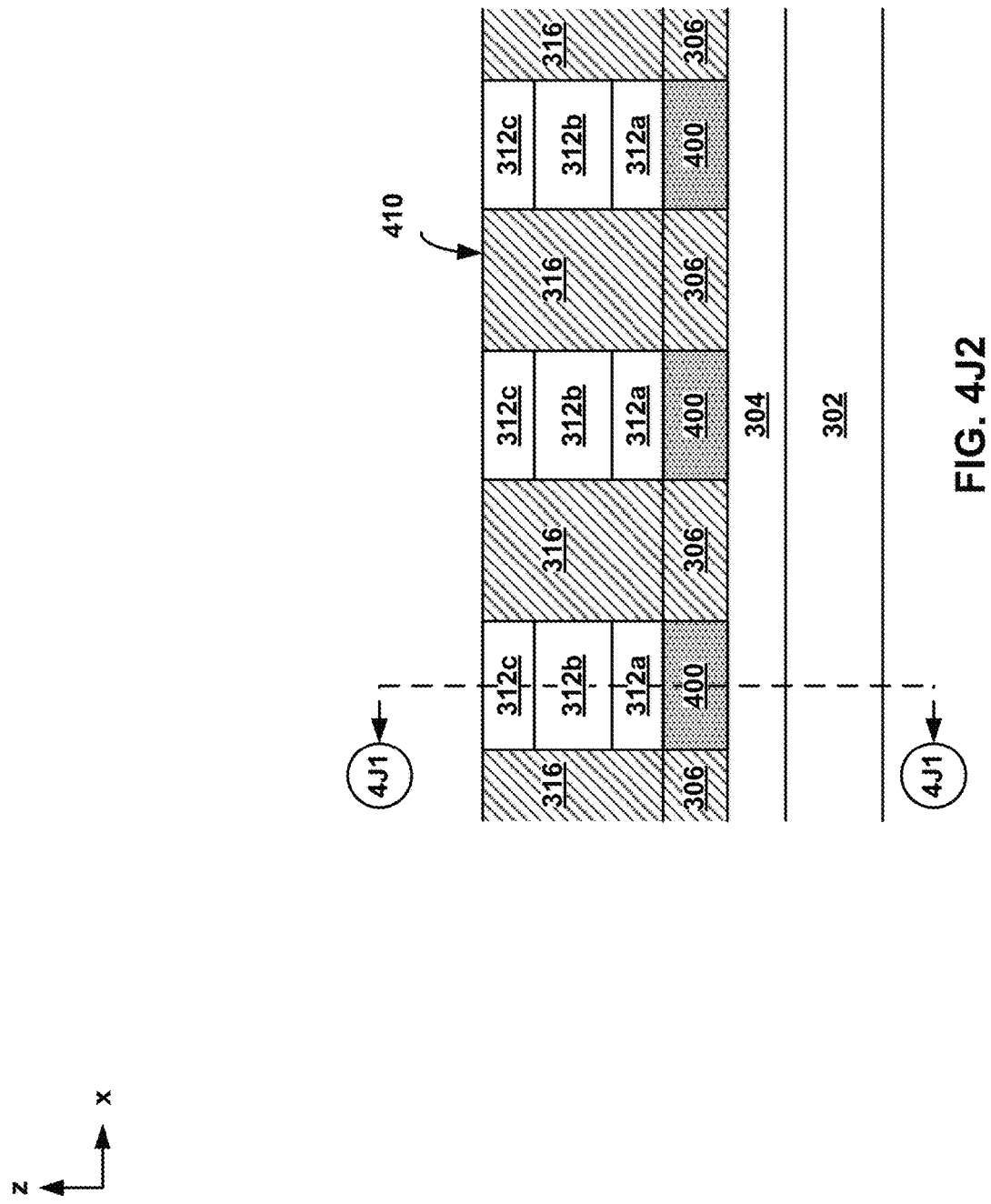

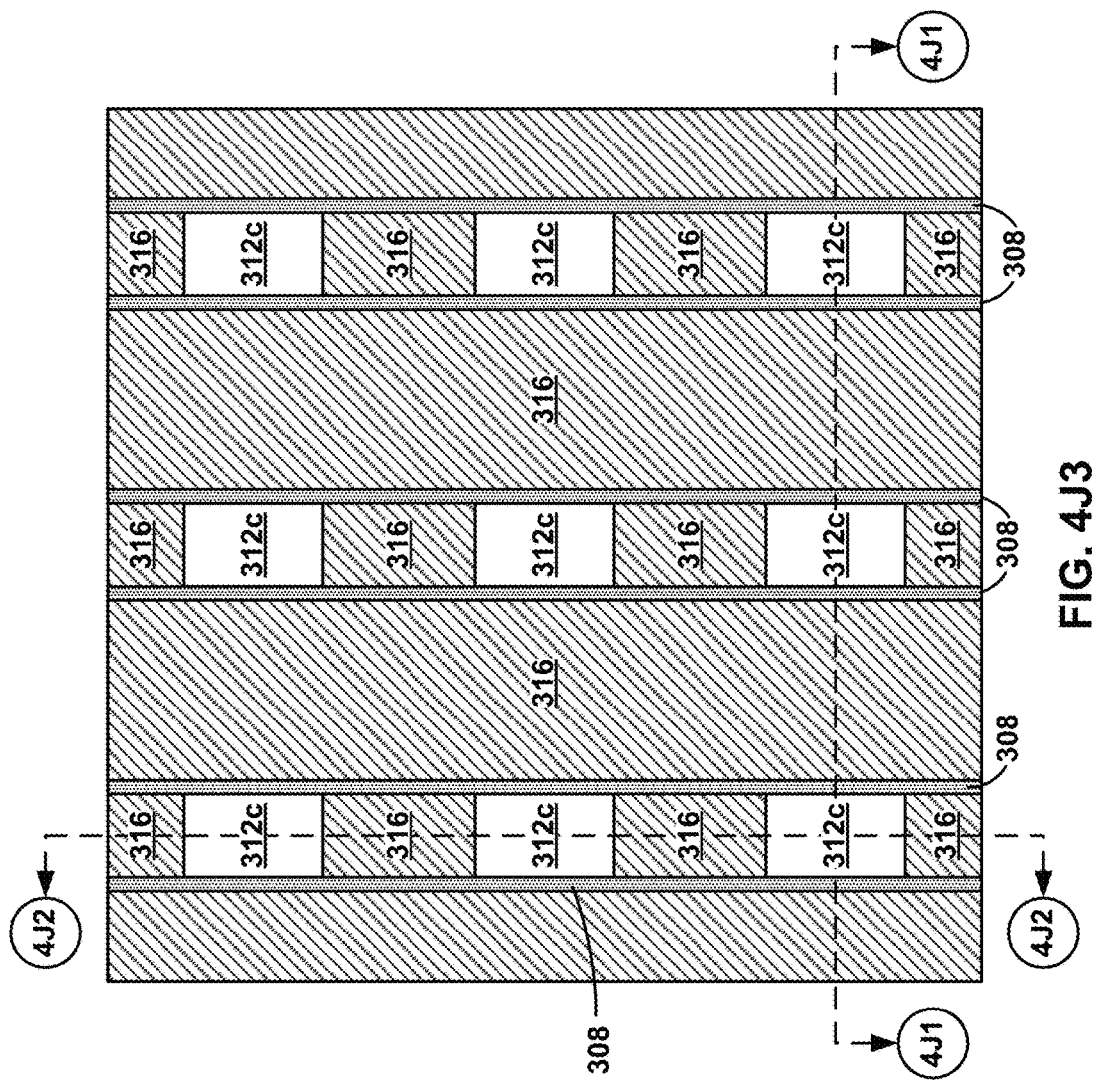
FIG. 4J3

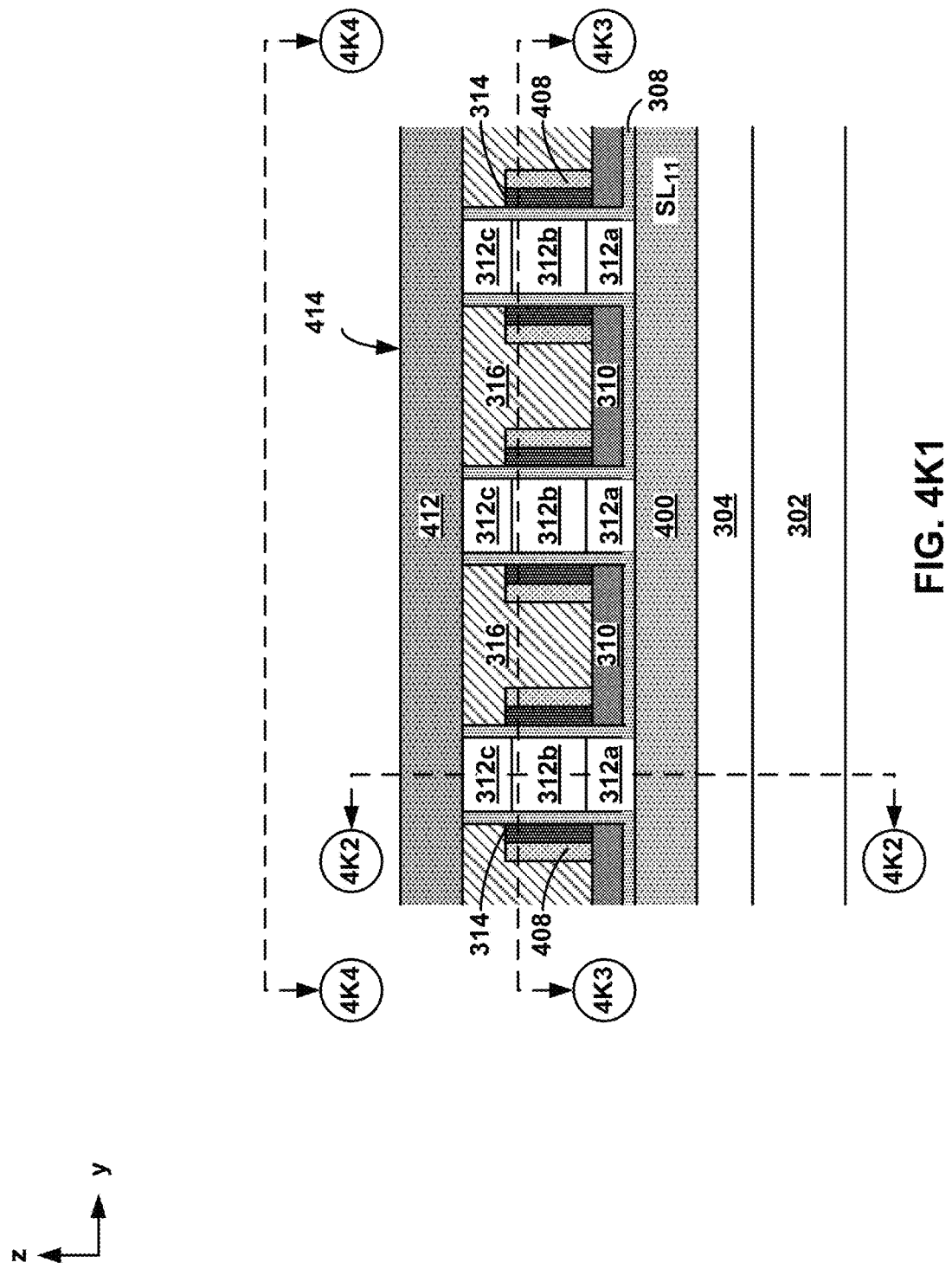
FIG. 4K1

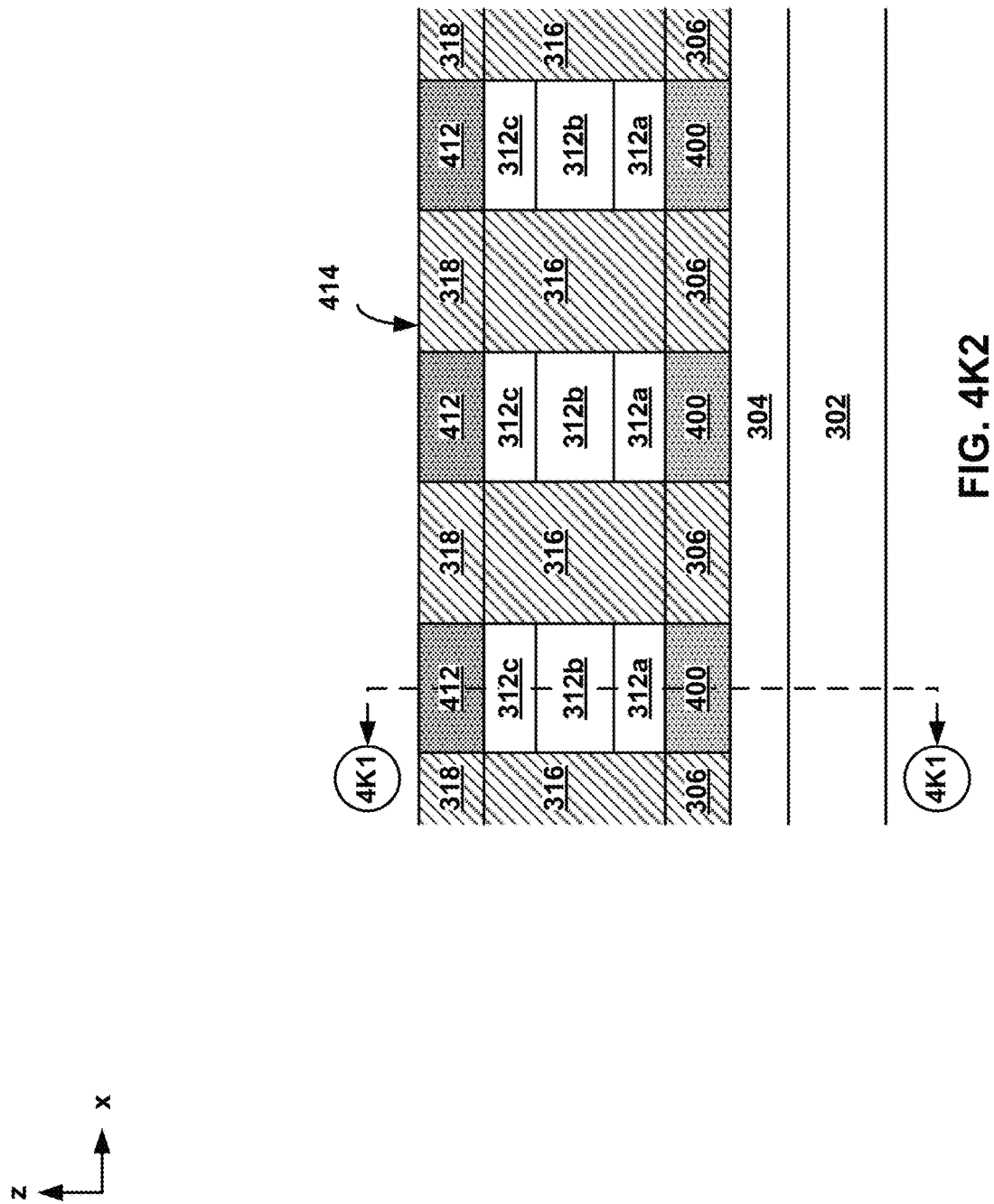

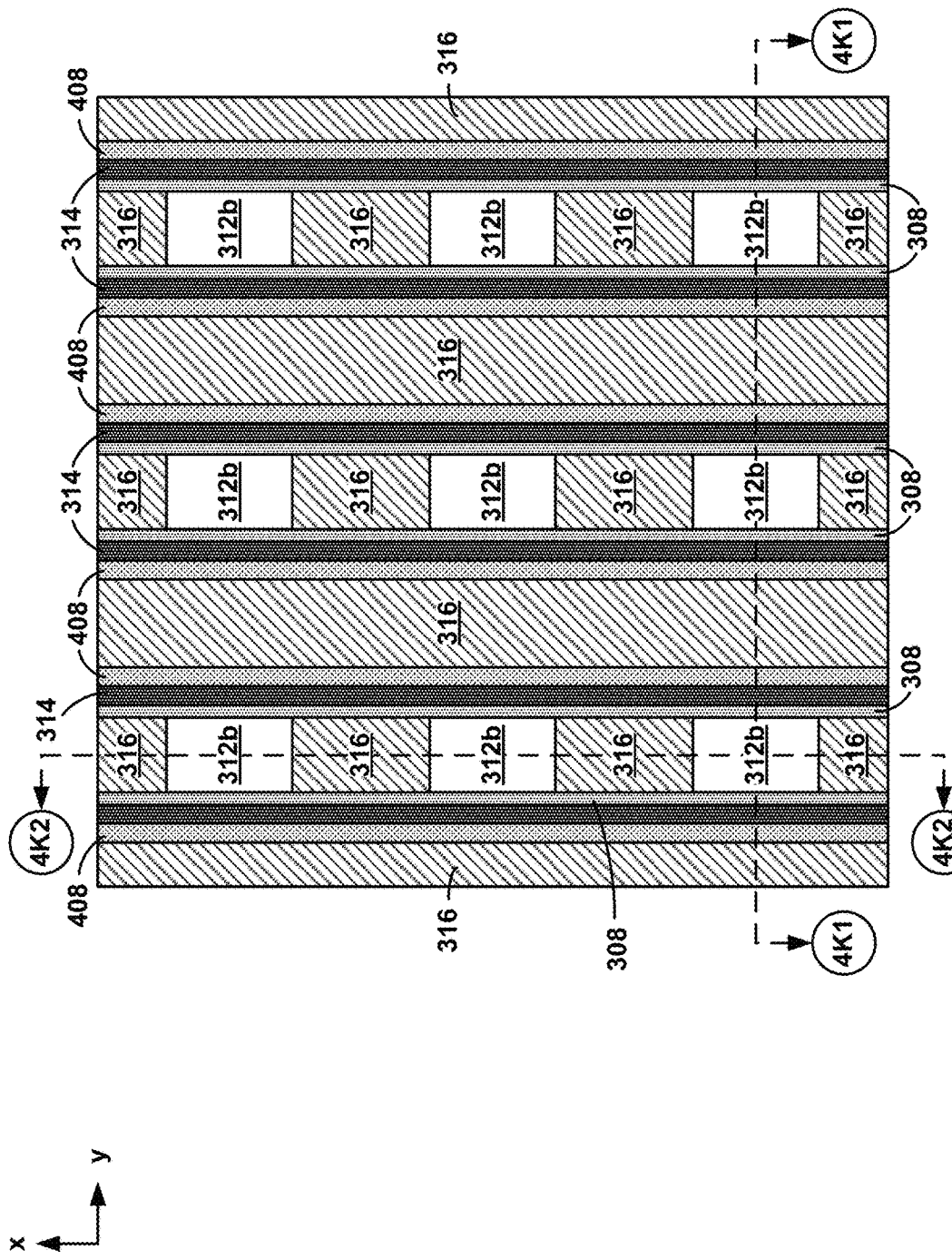
FIG. 4K3

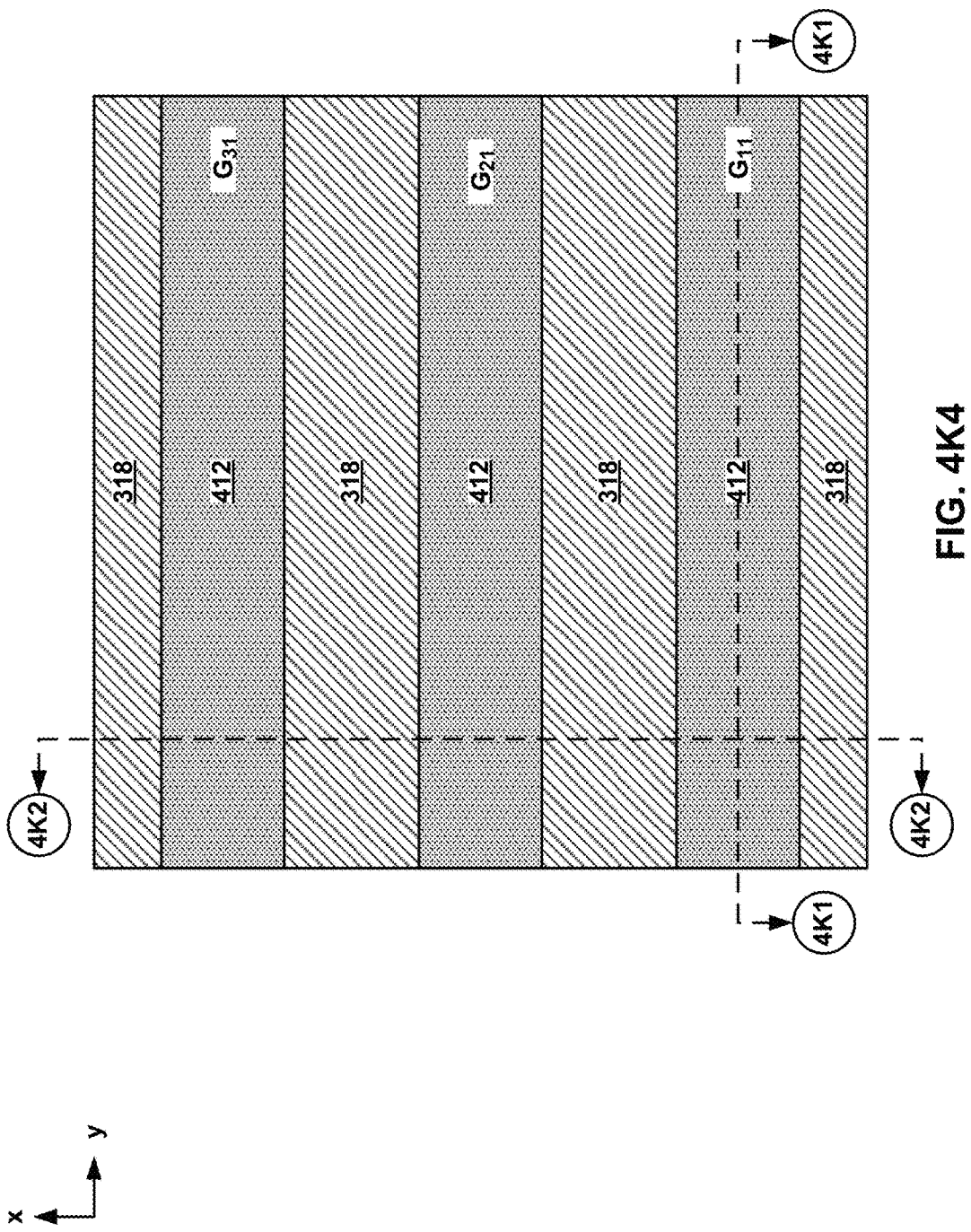

US 10,453,531 B1

CONTENT ADDRESSABLE MEMORY USING THRESHOLD-ADJUSTABLE VERTICAL TRANSISTORS AND METHODS OF FORMING THE SAME

BACKGROUND

This application relates to technology for non-volatile data storage. In particular, this application relates to content addressable memory (CAM) cells and memory arrays that include vertical transistors.

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery).

Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), phase change memory (e.g., PRAM), and reversible resistivity-switching memory (ReRAM). In recent years, non-volatile memory devices have been scaled to reduce the cost per bit. However, as process geometries shrink, many design and process challenges are presented.

BRIEF DESCRIPTION OF THE DRAWINGS

FIGS. 4A1-4K4 are cross-sectional views of a portion of a substrate during an example fabrication of the memory array of FIGS. 3A-3C.

DETAILED DESCRIPTION

Vertical single-transistor (1T) CAM memory elements, CAM memory arrays of vertical 1T memory elements, and monolithic three-dimension CAM memory arrays of vertical 1T memory elements are described. In particular, CAM memory elements are described that include a vertical transistor that includes a charge storage element.

In one embodiment, a non-volatile CAM storage system may include one or more two-dimensional arrays of non-volatile memory cells. The memory cells within a two-dimensional memory array may form a single layer of memory cells and may be selected via control lines (e.g., match lines, ground lines and search lines) in the X and Y directions. In another embodiment, a non-volatile CAM storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate.

In some embodiments, a non-volatile CAM storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading, programming or searching of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 1A:
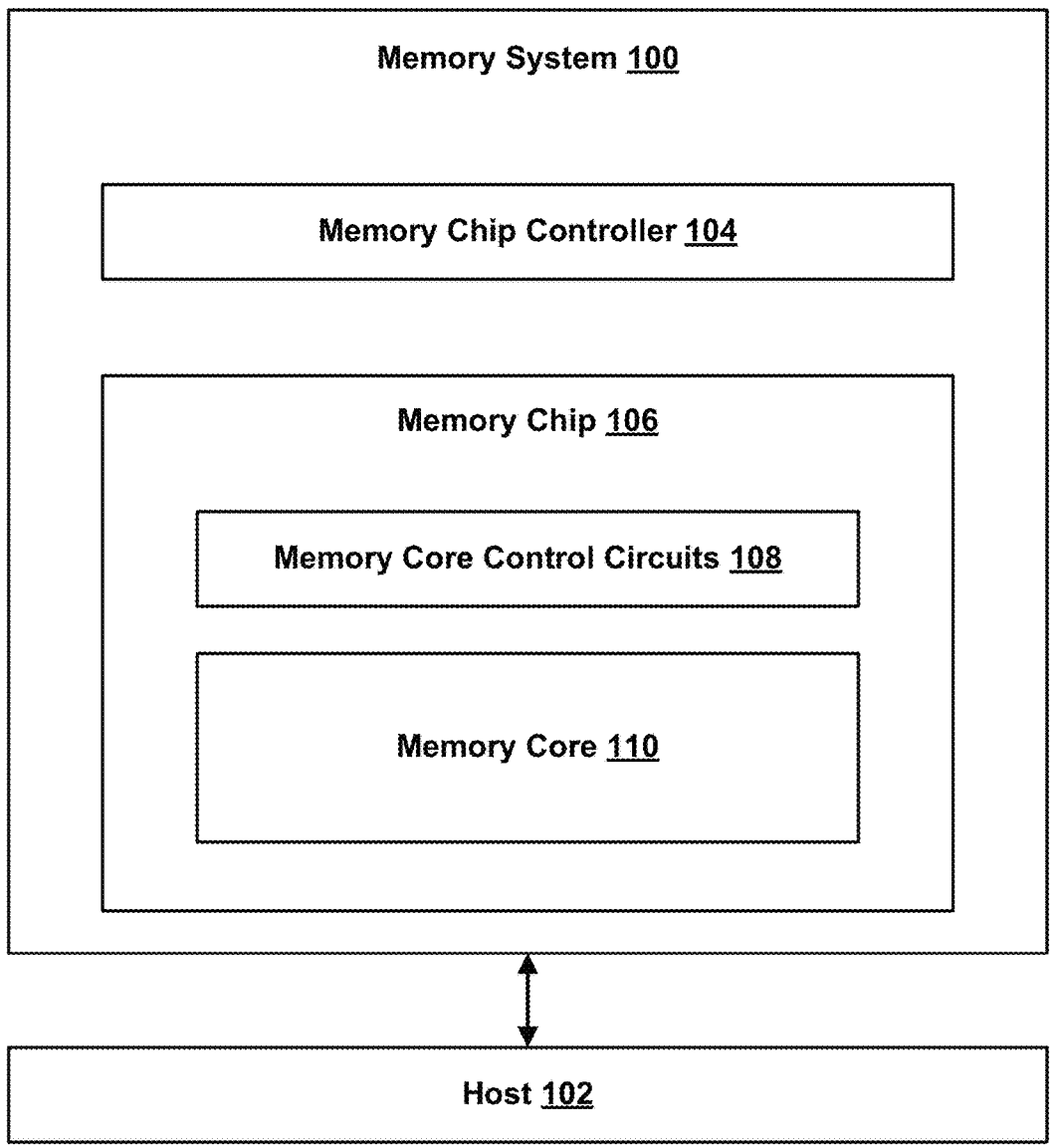
FIG. 1A depicts an embodiment of a memory system and a host.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, or generating row and column addresses.

Memory core 110 may include one or more two-dimensional arrays of memory cells or one or more three-dimensional arrays of memory cells. In one embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In one embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for match lines, ground lines and search lines within memory core 110, and generate the appropriate memory block, row, and column addresses.

In some embodiments, one or more managing or control circuits may be used for controlling the operation of a memory array. The one or more managing or control circuits may provide control signals to a memory array to perform a read operation, a write operation, and/or a search operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, reading and searching operations. In one example, one or more managing circuits may include an on-chip memory controller for determining row and column address, match line, ground line and search line addresses, memory array enable signals, and data latching signals.

Figure 1B:
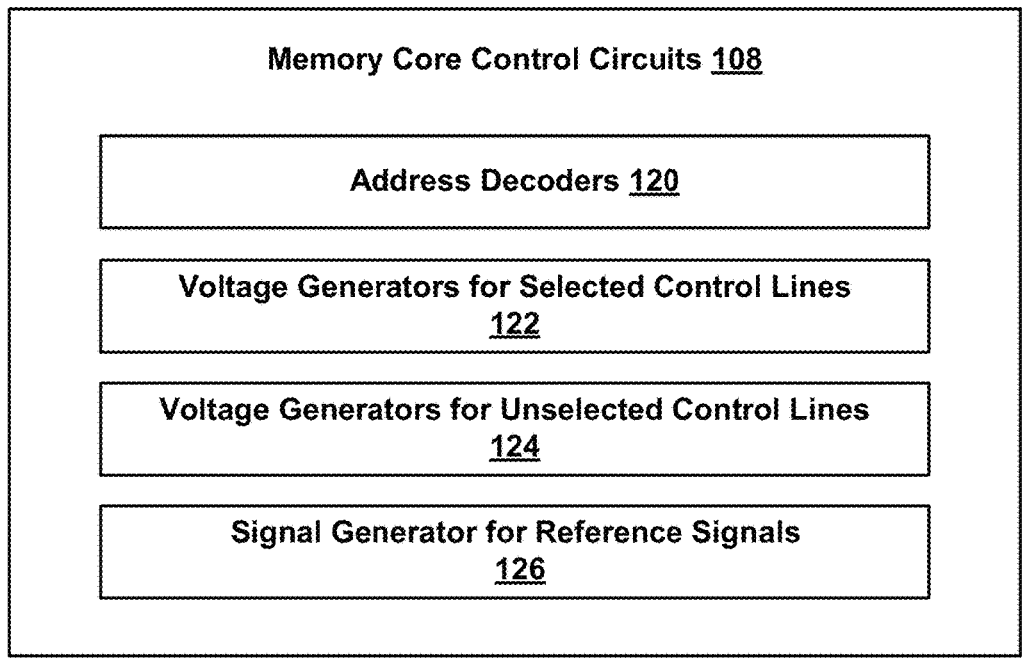
FIG. 1B depicts an embodiment of memory core control circuits.

FIG. 1B depicts an embodiment of memory core control circuits 108. As depicted, memory core control circuits 108 include address decoders 120, voltage generators for selected control lines 122, voltage generators for unselected control lines 124 and signal generators for reference signals 126 (described in more detail below). Control lines may include match lines, ground lines and search lines, or a combination of match lines, ground lines and search lines. Selected control lines may include selected match lines, selected ground lines and/or selected search lines that are used to place memory cells into a selected state. Unselected control lines may include unselected match lines, unselected ground lines and/or unselected search lines that are used to place memory cells into an unselected state.

Address decoders 120 may generate memory block addresses, as well as row addresses and column addresses for a particular memory block. Voltage generators (or voltage regulators) for selected control lines 122 may include one or more voltage generators for generating selected control line voltages. Voltage generators for unselected control lines 124 may include one or more voltage generators for generating unselected control line voltages. Signal generators for reference signals 126 may include one or more voltage and/or current generators for generating reference voltage and/or current signals.

FIGS. 1C-1F depict an embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
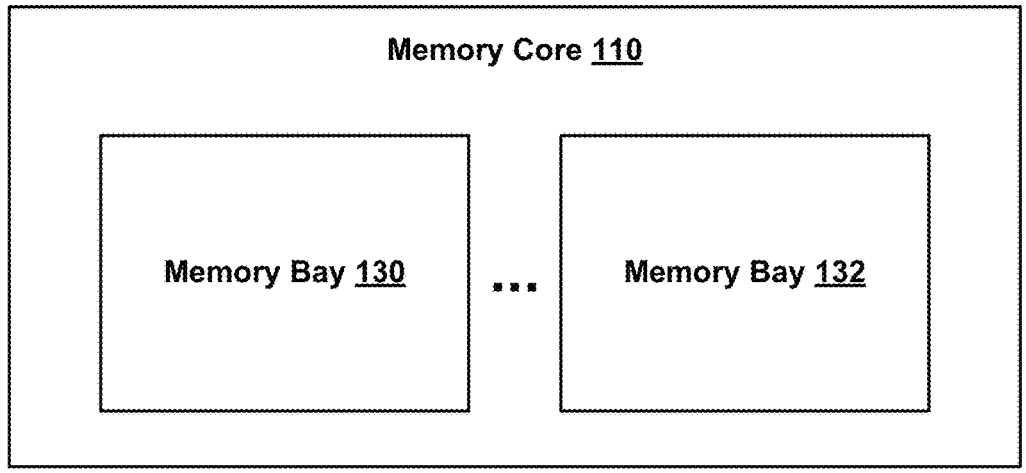
FIG. 1C depicts an embodiment of a memory core.

FIG. 1C depicts one embodiment of memory core 110 in FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 or other number of memory bays).

Figure 1D:
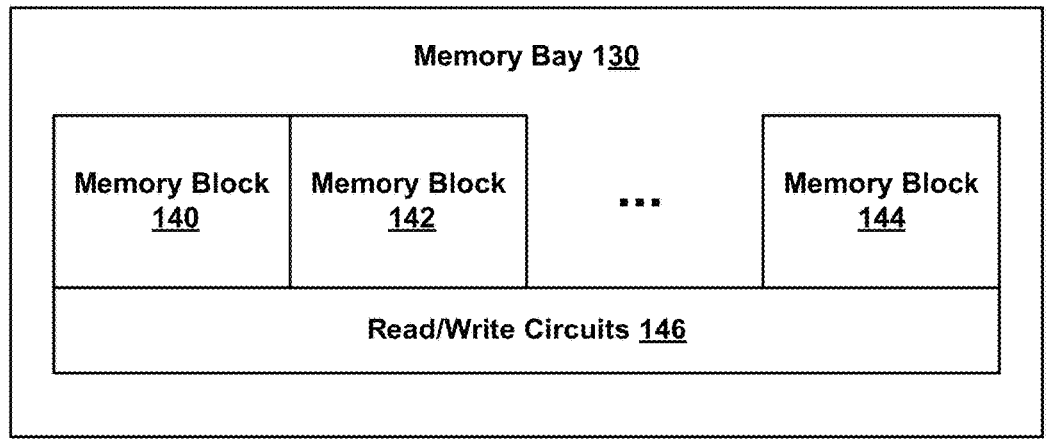
FIG. 1D depicts an embodiment of a memory bay.

FIG. 1D depicts one embodiment of memory bay 130 in FIG. 1C. As depicted, memory bay 130 includes memory blocks 140-144 and read/write circuits 146. In some embodiments, the number of memory blocks per memory bay may be different for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 in FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data states (i.e., the particular memory cell may include a multi-level memory cell). In one example, read/write circuits 146 may apply a first voltage difference (e.g., 2V) across the particular memory cell to program the particular memory cell into a first state of the three or more data states or a second voltage difference (e.g., 1V) across the particular memory cell that is less than the first voltage difference to program the particular memory cell into a second state of the three or more data states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period (e.g., 150 ns) to program the particular memory cell into a first state of the three or more data states or apply the first voltage difference across the particular memory cell for a second time period less than the first time period (e.g., 50n5). One or more programming pulses followed by a memory cell verification phase may be used to program the particular memory cell to be in the correct state.

Figure 1E:
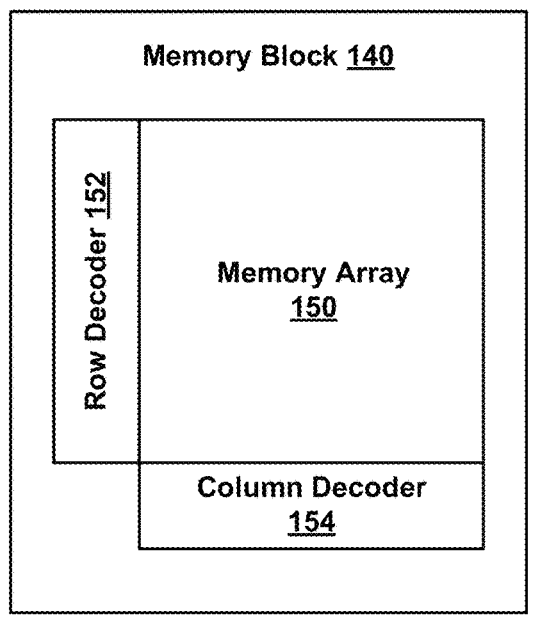
FIG. 1E depicts an embodiment of a memory block.

FIG. 1E depicts one embodiment of memory block 140 in FIG. 1D. As depicted, memory block 140 includes a memory array 150, row decoder 152, and column decoder 154. Memory array 150 may include a contiguous group of memory cells having contiguous search lines and match lines. Memory array 150 may include one or more layers of memory cells. Memory array 150 may include a two-dimensional memory array or a three-dimensional memory array.

Row decoder 152 decodes a row address and selects a particular search line in memory array 150 when appropriate (e.g., when reading or writing memory cells in memory array 150). Column decoder 154 decodes a column address and selects one or more match lines in memory array 150 to be electrically coupled to read/write circuits, such as read/write circuits 146 in FIG. 1D. In one embodiment, the number of search lines is 4K per memory layer, the number of match lines is 1K per memory layer, and the number of memory layers is 4, providing a memory array 150 containing 16K memory cells.

Figure 1F:
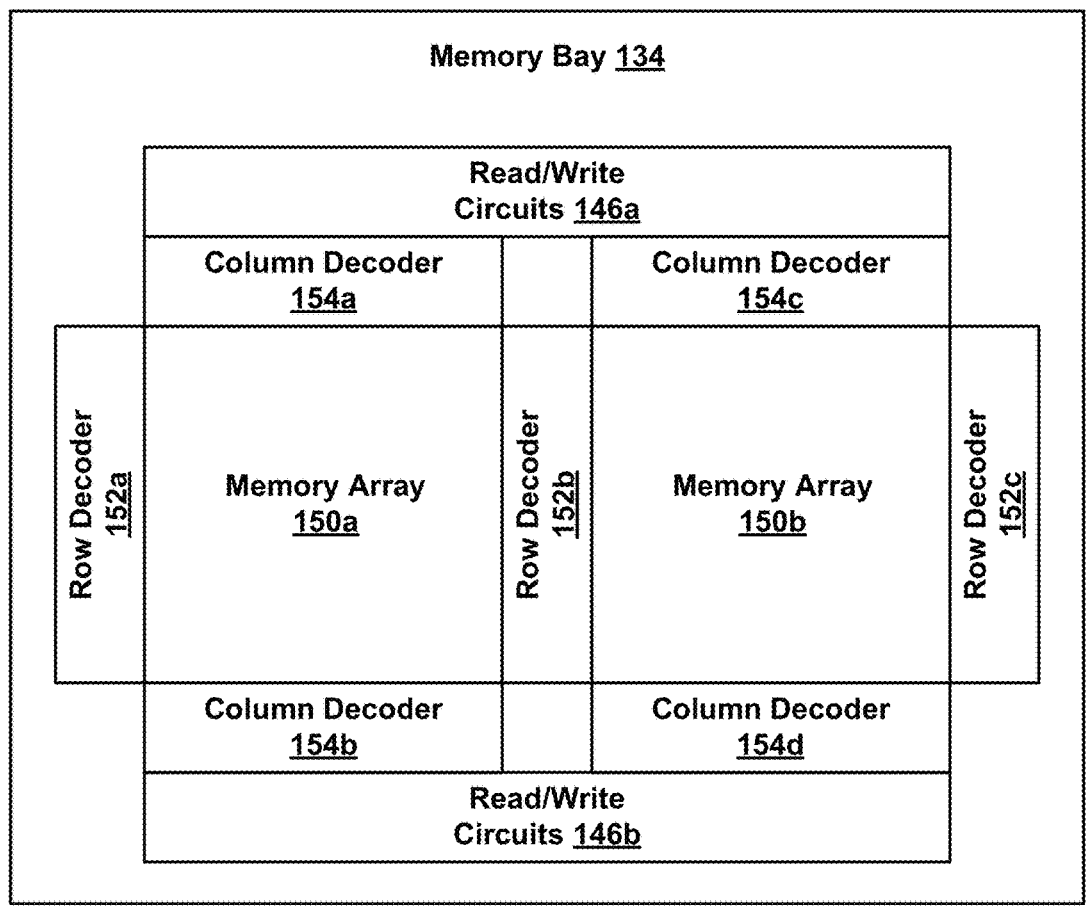
FIG. 1F depicts another embodiment of a memory bay.

FIG. 1F depicts one embodiment of a memory bay 134. Memory bay 134 is one example of an alternative implementation for memory bay 130 in FIG. 1D. In some embodiments, row decoders, column decoders, and read/write circuits may be split or shared between memory arrays. As depicted, row decoder 152b is shared between memory arrays 150a and 150b because row decoder 152b controls search lines in both memory arrays 150a and 150b (i.e., the search lines driven by row decoder 152b are shared).

Row decoders 152a and 152b may be split such that even search lines in memory array 150a are driven by row decoder 152a and odd search lines in memory array 150a are driven by row decoder 152b. Row decoders 152c and 152b may be split such that even search lines in memory array 150b are driven by row decoder 152c and odd search lines in memory array 150b are driven by row decoder 152b.

Column decoders 154a and 154b may be split such that even match lines in memory array 150a are controlled by column decoder 154b and odd match lines in memory array 150a are driven by column decoder 154a. Column decoders 154c and 154d may be split such that even match lines in memory array 150b are controlled by column decoder 154d and odd match lines in memory array 150b are driven by column decoder 154c.

The selected match lines controlled by column decoder 154a and column decoder 154c may be electrically coupled to read/write circuits 146a. The selected match lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 2A:
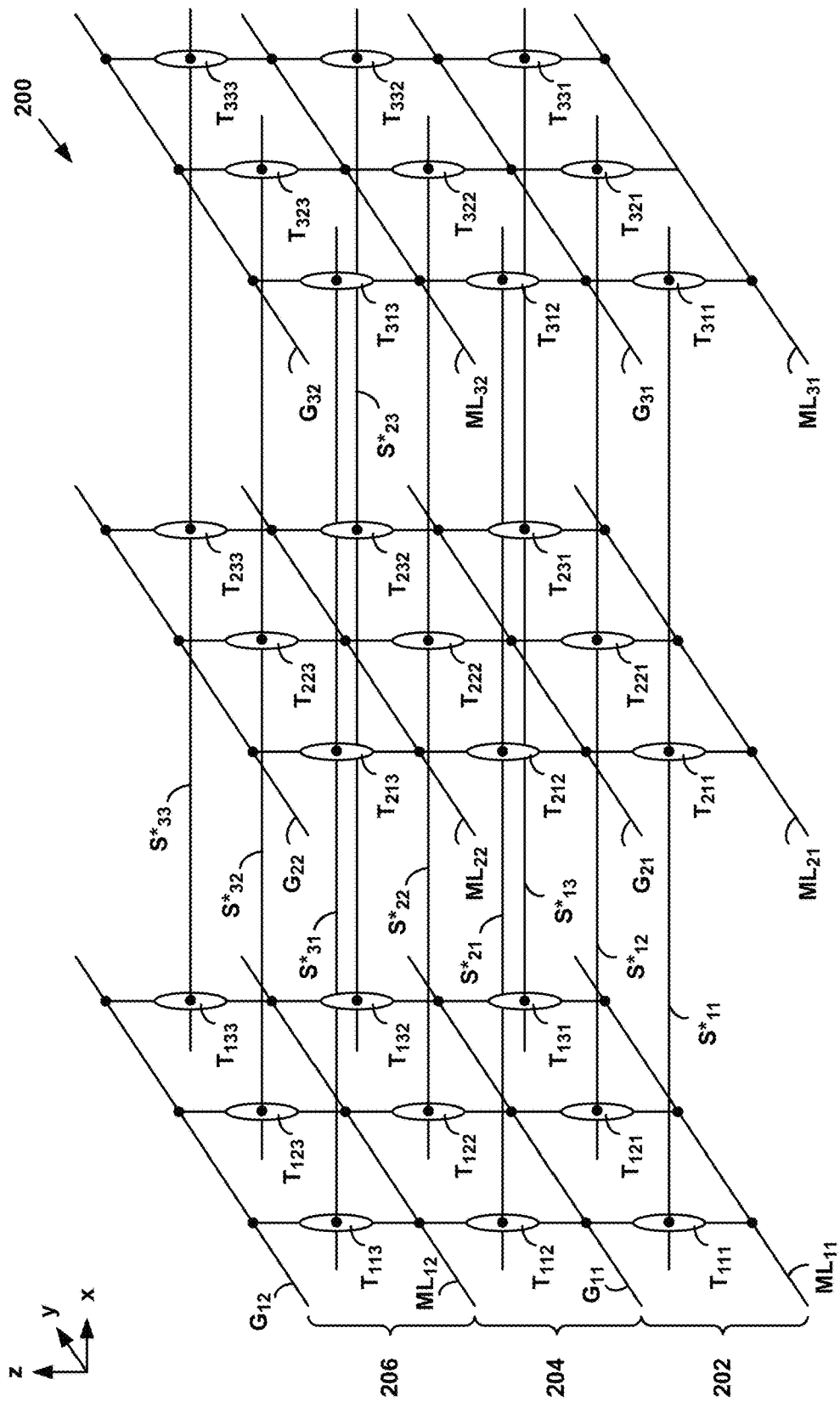
FIG. 2A depicts an embodiment of a portion of a monolithic three-dimensional memory array.

FIG. 2A depicts an embodiment of a portion of a monolithic three-dimensional CAM memory cell array 200 that includes a first memory level 202, a second memory level 204 positioned above first memory level 202, and a third memory level 206 positioned above second memory level 204. CAM memory cell array 200 is one example of an implementation for memory array 150 in FIG. 1E. CAM memory cell array 200 includes match lines $ML_{11}$-$ML_{32}$ and ground lines $G_{11}$-$G_{32}$ arranged in a first direction (e.g., an x-direction), and search line pairs $S^*_{11}$-$S^*_{33}$ are arranged in a second direction (e.g., a y-direction) perpendicular to the first direction.

In other embodiments, match lines $ML_{11}$-$ML_{32}$ may be arranged in a first direction (e.g., an x-direction), and search line pairs $S^*_{11}$-$S^*_{33}$ may be arranged in a second direction (e.g., a y-direction) perpendicular to the first direction. In embodiments, ground lines $G_{11}$-$G_{32}$ may be biased to a GROUND potential (e.g., 0V). In other embodiments, ground lines $G_{11}$-$G_{32}$ may be biased to another potential (e.g., a "floating ground" value or some other value).

CAM memory cell array 200 also includes CAM memory elements $T_{111}$-$T_{333}$, each disposed between a corresponding one of match lines $ML_{11}$-$ML_{32}$ and a corresponding one of ground lines $G_{11}$-$G_{32}$, and each coupled to a corresponding one of search line pairs $S^*_{11}$-$S^*_{33}$. For example, CAM memory element $T_{111}$ is disposed between match line $ML_{11}$ and ground line $G_{11}$, and is coupled to search line pair $S^*_{11}$. Likewise, CAM memory element $T_{232}$ is disposed between match line $ML_{22}$ and ground line $G_{22}$, and is coupled to search line pair $S^*_{23}$.

In an embodiment, each of CAM memory elements $T_{111}$-$T_{333}$ includes one or more devices whose threshold voltage can be programmed, such as ferroelectric memory elements or charge storage memory elements (e.g., a transistor that includes a floating gate or a charge trapping layer). In an embodiment, each of CAM memory elements $T_{111}$-$T_{333}$ includes a ferroelectric field-effect transistor (Fe-FET). In another embodiment, each of CAM memory elements $T_{111}$-$T_{333}$ includes more than one Fe-FET. For simplicity, in the remaining discussion, each of CAM memory elements $T_{111}$-$T_{333}$ will be assumed to have one or more Fe-FETs, and also will be referred to herein as vertical FeFETs $T_{111}$-$T_{333}$. In an embodiment, each of CAM memory elements $T_{111}$-$T_{333}$ includes one or more Fe-FET and includes no other circuit elements.

Figure 2B:
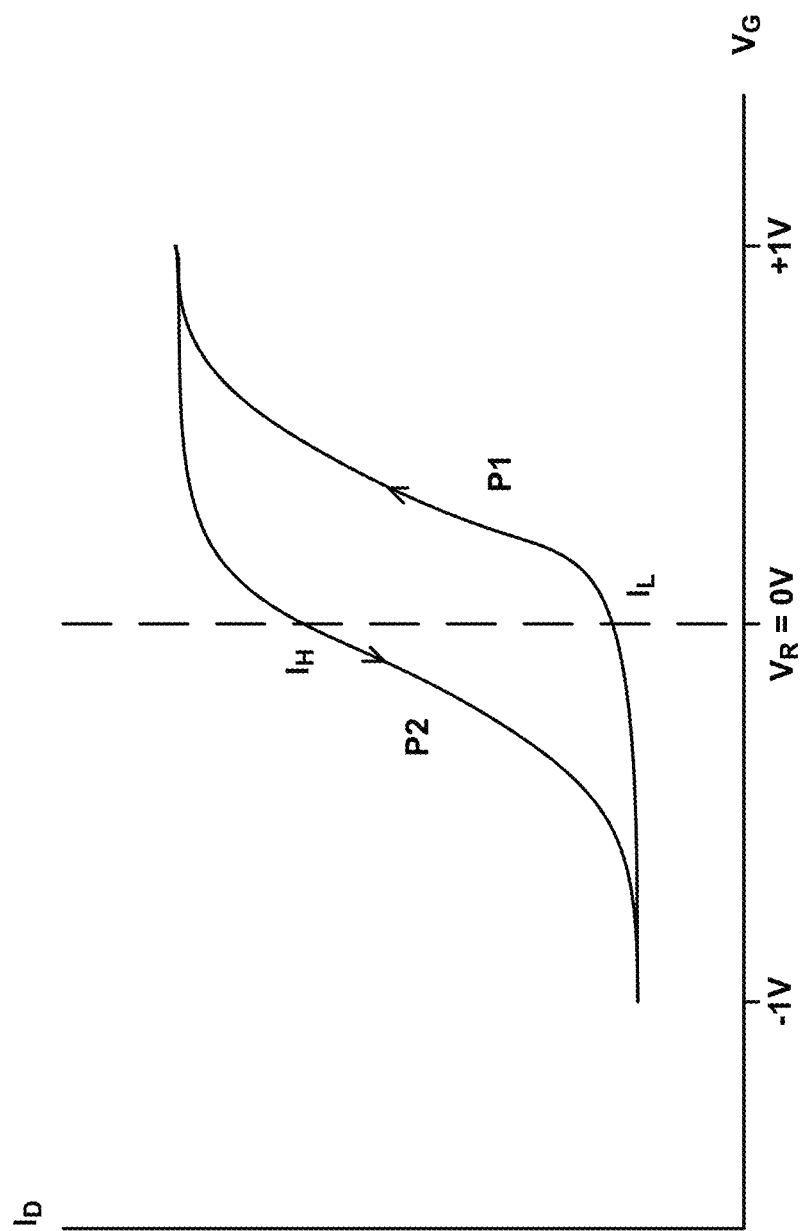
FIG. 2B depicts an example electrical characteristic of a ferroelectric field effect transistor.

FIG. 2B depicts an illustrative electrical characteristic (drain current ID versus gate voltage $V_G$) plot of a FeFET. As illustrated in FIG. 2B, by virtue of applying a positive or negative voltage to the gate electrode of a FeFET, the polarization of the FeFET can be flipped from a first polarization state (e.g., P1) to a second polarization state (e.g., P2). After the gate voltage is removed, the FeFET retains the polarization state.

To read a selected FeFET, a read voltage $V_R$ (e.g., 0V) is applied to the gate of the selected FeFET, and the drain current of the FeFET is measured. A measured drain current of $I_H$ may correspond to a first memory state, whereas a measured drain current of $I_L$ may correspond to a second memory state.

Referring again to FIG. 2A, in an embodiment, each of CAM memory elements $T_{111}$-$T_{333}$ includes a vertical Fe-FET that has a ferroelectric gate oxide material. In an embodiment, the ferroelectric gate oxide material includes hafnium oxide. In an embodiment, the ferroelectric gate oxide material includes hafnium oxide doped with one or more of silicon, aluminum, zirconium, yttrium, gadolinium, calcium, cerium, dysprosium, erbium, germanium, scandium, and tin.

In an embodiment, the hafnium oxide is doped with silicon with a concentration of about 2 to about 5 atomic %. In another embodiment, the ferroelectric gate oxide material includes hafnium zirconium oxide, where the ratio of hafnium to zirconium atomic concentrations is 1 to 1. In an embodiment, the doped hafnium oxide is in a crystalline or polycrystalline morphology. The crystal grains of the doped hafnium oxide are switched, either separately or as an ensemble, between a first polarization state (e.g., P1) to a second polarization state (e.g., P2).

Figure 2C:
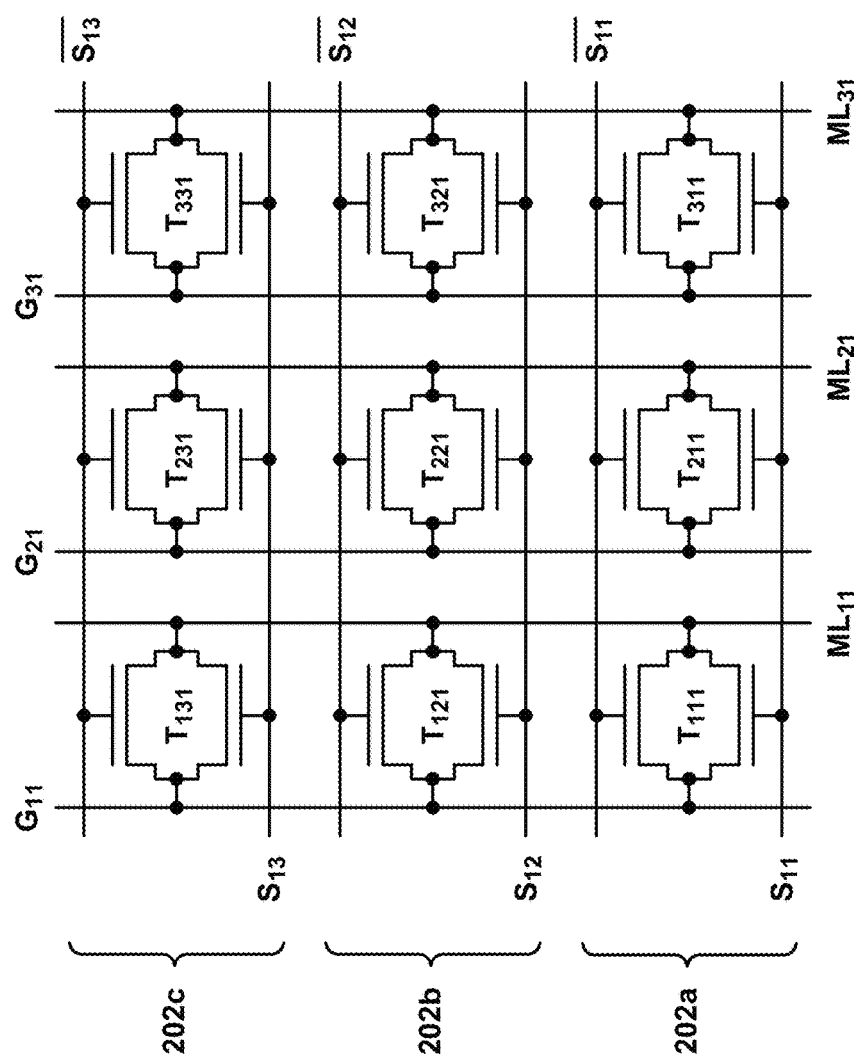
FIGS. 2C-2E depict an embodiment of a first memory level, a second memory level, and a third memory level, respectively, of the memory array of FIG. 2A FIGS. 2F-2H depict perspective views of an embodiment of a first row, a second row and a third row of the first memory level of FIG. 2C.
Figure 2D:
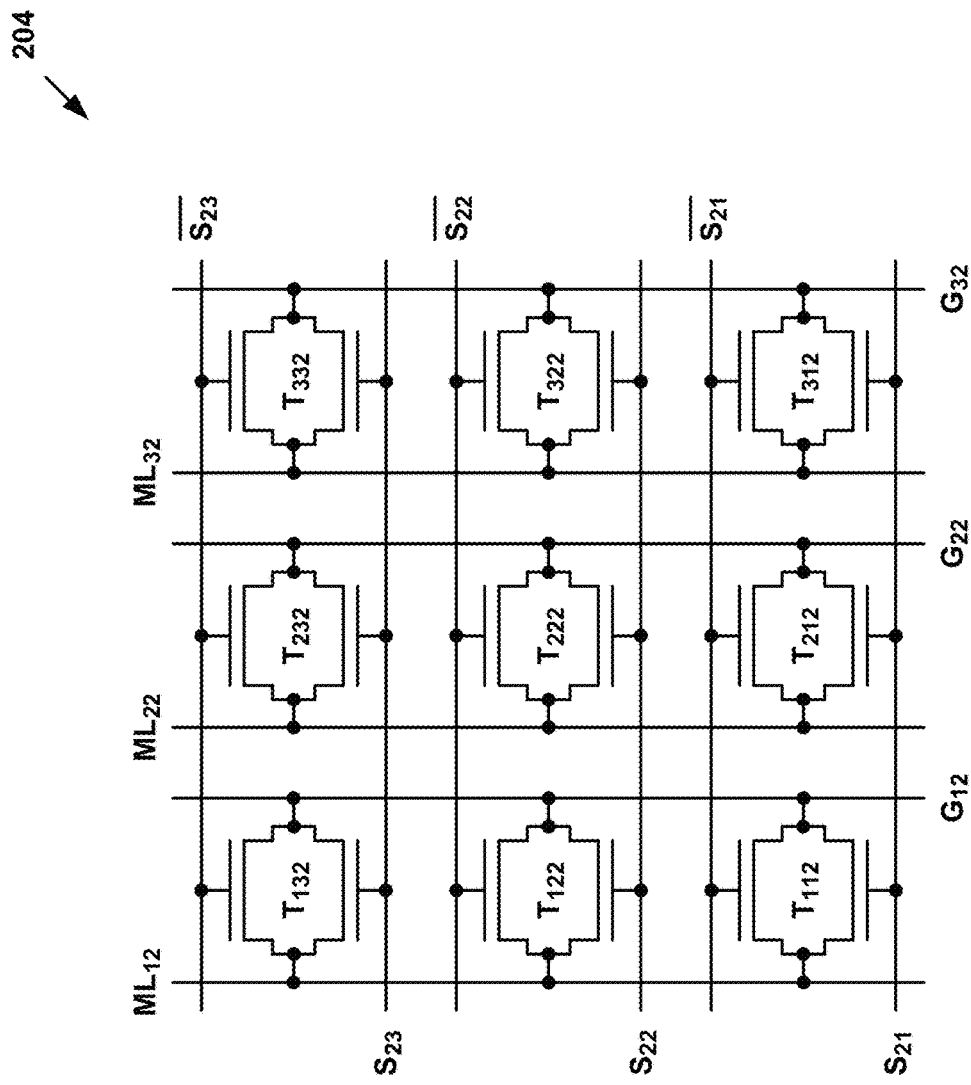
Figure 2E:
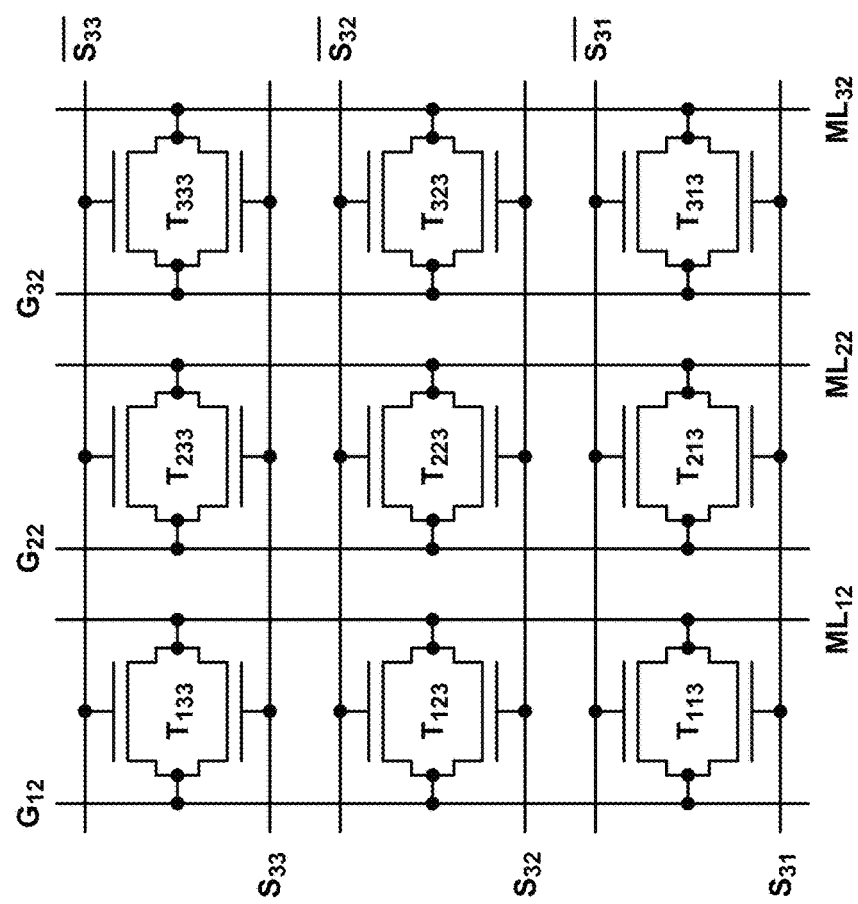

FIGS. 2C-2E depict an embodiment of first memory level 202, second memory level 204, and third memory level 206, respectively, of CAM memory cell array 200 of FIG. 2A. Each of CAM memory elements $T_{111}$-$T_{333}$ includes a dual-gated vertical Fe-FET having a first electrode (e.g., a drain/source electrode) coupled to one of match lines $ML_{11}$-$ML_{32}$, a second electrode (e.g., a source/drain electrode) coupled to one of ground lines $G_{11}$-$G_{32}$, and a third electrode (e.g., a gate electrode) coupled to one of search line pairs $S^*_{11}$-$S^*_{33}$. Persons of ordinary skill in the art will understand that ground lines $G_{11}$-$G_{32}$ alternatively may be disposed above match lines $ML_{11}$-$ML_{32}$, with each CAM memory element $T_{111}$-$T_{333}$ coupled between one of match lines $ML_{11}$-$ML_{32}$ and one of ground lines $G_{11}$-$G_{32}$.

To avoid overcrowding the drawing, CAM memory elements $T_{111}$-$T_{333}$ in FIGS. 2C-2E are depicted as "flattened" Fe-FETs rather than as vertical transistors. Each of search line pairs $S^*_{11}$-$S^*_{33}$ includes a search line and a complementary search line (e.g., search line pair $S^*_{11}$ includes a search line $S_{11}$ and a complementary line $\overline{S_{11}}$) that are coupled to a corresponding first gate electrode and second gate electrode, respectively, of CAM memory elements $T_{111}$-$T_{333}$. As used herein, a search line and a complementary search line have complementary states. For example, if search line $S_{11}$ has a first state (e.g., HIGH, or +V), complementary line $\overline{S_{11}}$ has a second state (e.g., LOW, or −V) complementary to the first state.

For example, CAM memory element $T_{221}$ (FIG. 2C) has a first electrode (e.g., a drain/source electrode) coupled to match line $ML_{21}$, a second electrode (e.g., a source/drain electrode) coupled to ground line $GL_{21}$, a first gate electrode coupled to search line $S_{12}$ and a second gate electrode coupled to complementary search line $\overline{S_{12}}$.

Likewise, CAM memory element $T_{332}$ (FIG. 2D) has a first electrode (e.g., a drain/source electrode) coupled to match line $ML_{32}$, a second electrode (e.g., a source/drain electrode) coupled to ground line $G_{32}$, a first gate electrode coupled to search line $S_{23}$ and a second gate electrode coupled to complementary search line $\overline{S_{23}}$.

Similarly, CAM memory element $T_{133}$ (FIG. 2E) has a first electrode (e.g., a drain/source electrode) coupled to match line $ML_{12}$, a second electrode (e.g., a source/drain electrode) coupled to ground line $G_{12}$, a first gate electrode coupled to search line $S_{33}$ and a second gate electrode coupled to complementary search line $\overline{S_{33}}$.

In the embodiment depicted in FIGS. 2C-2E, the first gate electrode and the second gate electrode of each of CAM memory elements $T_{111}$-$T_{333}$ are disposed on opposite sides of the vertical transistor. In embodiments in which each of CAM memory elements $T_{111}$-$T_{333}$ include vertical FeFETs, the first gate electrode may be used to selectively induce a first conductive channel between the first electrode and the second electrode of the vertical Fe-FET, and set the polarization state (P1/P2) of a first portion of the vertical FeFET, and the second gate electrode may be used to selectively induce a second conductive channel between the first electrode and the second electrode of the vertical Fe-FET, and set the polarization state (P1/P2) of a second portion of the vertical FeFET.

The first gate electrode and the second gate electrode of each of CAM memory elements $T_{111}$-$T_{333}$ are independent control terminals that may be used to set polarization states (P1/P2) of the first portion and the second portion, respectively, of the vertical Fe-FET. In such an embodiment, the search line may be used to individually set polarization states (P1/P2) of a first portion of the vertical FeFET, and the complementary search line may be used to individually set polarization states (P1/P2) of the second portion of the vertical Fe-FET. In this regard, each dual-gated vertical Fe-FET may be considered as two parallel-coupled single-gated vertical Fe-FETs.

In embodiments in which each of CAM memory elements $T_{111}$-$T_{333}$ include charge storage memory elements (e.g., a transistor that includes a floating gate or a charge trapping layer), the first gate electrode may be used to selectively induce a first conductive channel between the first electrode and the second electrode of the vertical transistor, and set a first threshold voltage VTH1 of a first portion of the vertical transistor, and the second gate electrode may be used to selectively induce a second conductive channel between the first electrode and the second electrode of the vertical transistor, and set a second threshold voltage VTH2 of a second portion of the vertical transistor.

The first gate electrode and the second gate electrode of each of CAM memory elements $T_{111}$-$T_{333}$ are independent control terminals that may be used to set first threshold voltage VTH1 of the first portion and second threshold voltage VTH2 of the second portion, respectively, of the vertical transistor. In such an embodiment, the search line may be used to individually set first threshold voltage VTH1 of a first portion of the vertical transistor, and the complementary search line may be used to individually set second threshold voltage VTH2 of the second portion of the vertical transistor. In this regard, each dual-gated vertical transistor may be considered as two parallel-coupled single-gated vertical transistors.

Figure 2F:
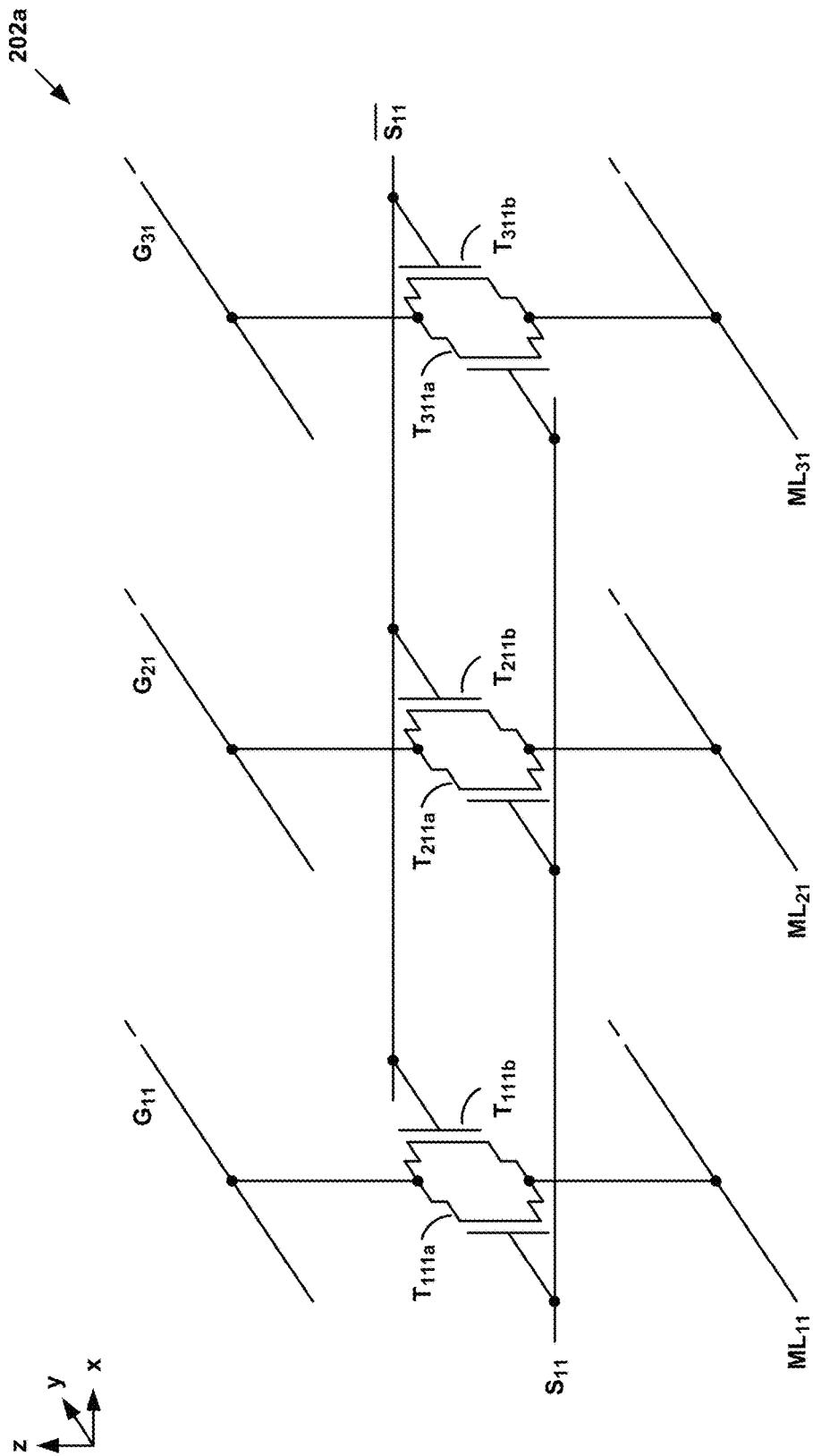
Figure 2G:
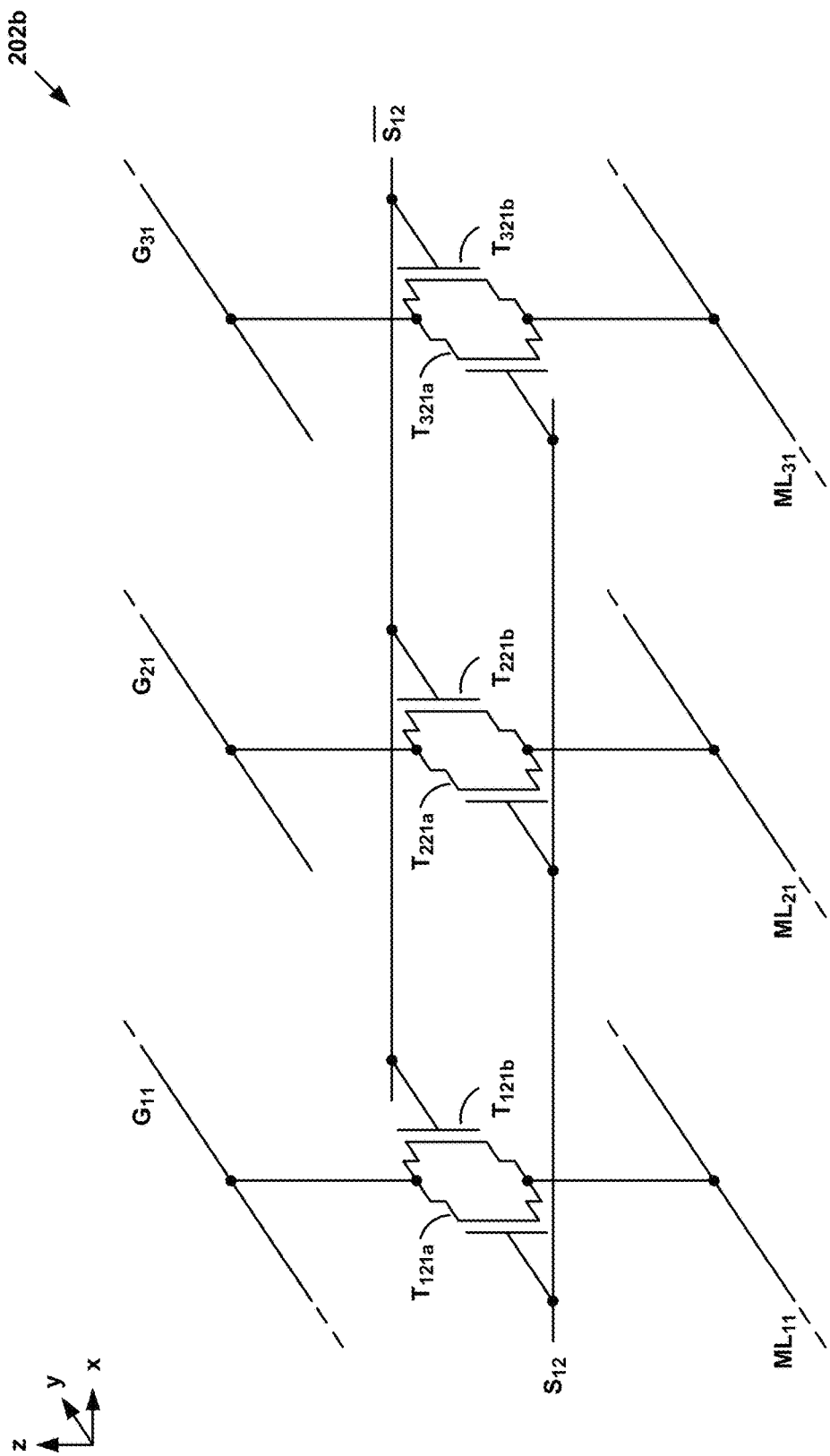
Figure 2H:
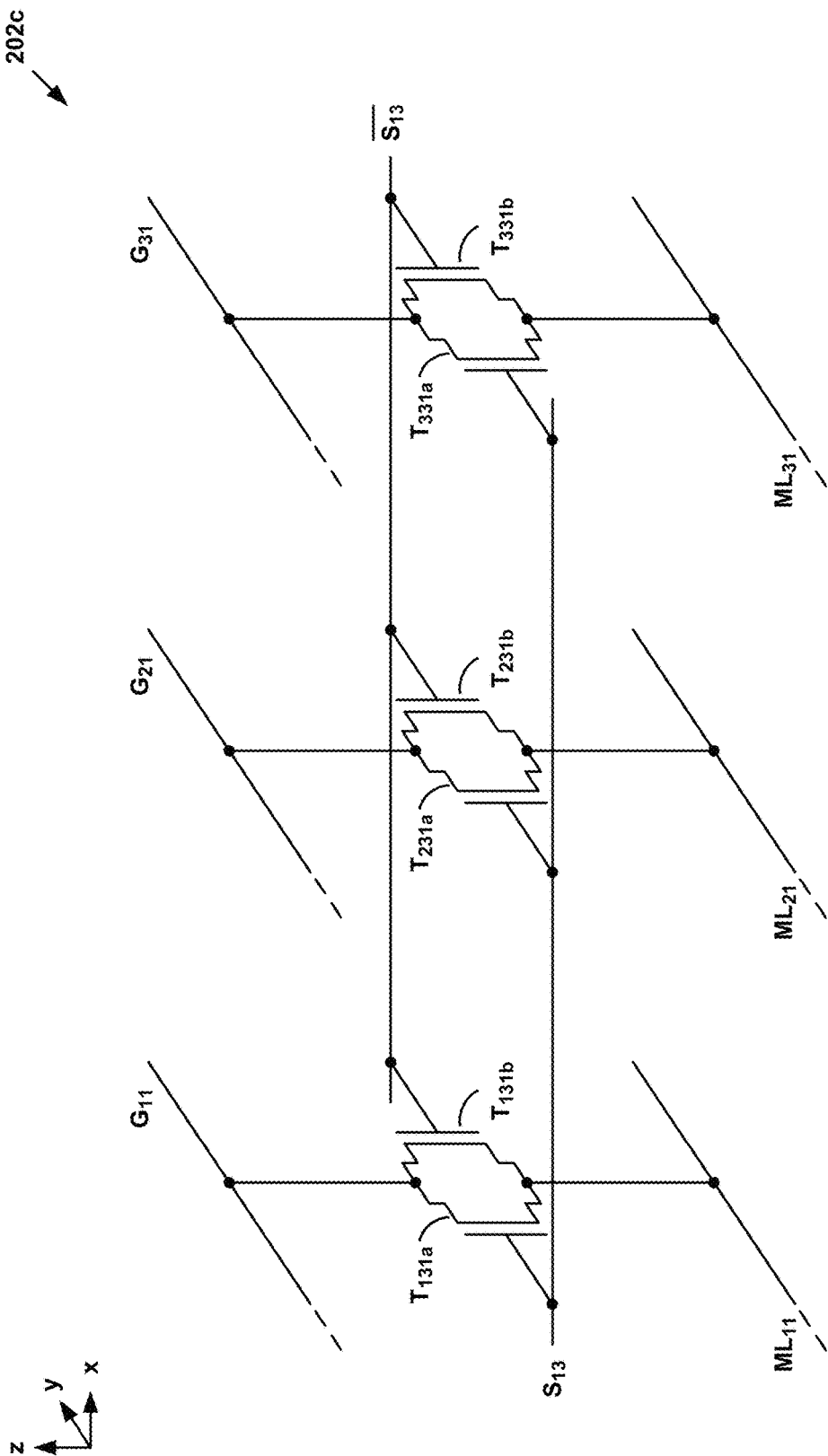

For example, FIGS. 2F-2H, depict an embodiment of a first row 202a of CAM memory elements $T_{111}$, $T_{211}$ and $T_{311}$, a second row 202b of CAM memory elements $T_{121}$, $T_{221}$ and $T_{321}$, and a third row 202c of CAM memory elements $T_{131}$, $T_{231}$ and $T_{331}$, respectively, of first memory level 202 of FIG. 2C. In particular, each of CAM memory elements $T_{111}$-$T_{331}$ includes: a first memory cell including a first vertical Fe-FET coupled in parallel with a second memory cell including a second vertical Fe-FET, with the first gate electrode controlling the first vertical Fe-FET and the second gate electrode controlling the second vertical Fe-FET.

Referring to FIG. 2F, CAM memory element $T_{111}$ includes a first memory cell $T_{111a}$ including a first vertical Fe-FET coupled in parallel with a second memory cell $T_{111b}$ including a second vertical Fe-FET, both coupled between match line $ML_{11}$ and ground line $G_{11}$, CAM memory element $T_{211}$ includes a first memory cell $T_{211a}$ including a first vertical Fe-FET coupled in parallel with a second memory cell $T_{211b}$ including a second vertical Fe-FET, both coupled between match line $ML_{21}$ and ground line $G_{21}$, and CAM memory element $T_{311}$ includes a first memory cell $T_{311a}$ including a first vertical Fe-FET coupled in parallel with a second memory cell $T_{311b}$ including a second vertical Fe-FET, both coupled between match line $ML_{31}$ and ground line $G_{31}$. First memory cells $T_{111a}$, $T_{211a}$, and $T_{311a}$ each have first gate electrodes coupled to search line $S_{11}$, and second memory cells $T_{111b}$, $T_{211b}$, and $T_{311b}$ each have second gate electrodes coupled to complementary search line $\overline{S_{11}}$.

Referring to FIG. 2G, CAM memory element $T_{121}$ includes a first memory cell $T_{121a}$ including a first vertical Fe-FET coupled in parallel with a second memory cell $T_{121b}$ including a second vertical Fe-FET, both coupled between match line $ML_{11}$ and ground line $G_{11}$, CAM memory element $T_{221}$ includes a first memory cell $T_{221a}$ including a first vertical Fe-FET coupled in parallel with a second memory cell $T_{221b}$ including a second vertical Fe-FET, both coupled between match line $ML_{21}$ and ground line $G_{21}$, and CAM memory element $T_{321}$ includes a first memory cell $T_{321a}$ including a first vertical Fe-FET coupled in parallel with a second memory cell $T_{321b}$ including a second vertical Fe-FET, both coupled between match line $ML_{31}$ and ground line $G_{31}$. First memory cells $T_{121a}$, $T_{221a}$, and $T_{321a}$ each have first gate electrodes coupled to search line $S_{12}$, and second memory cells $T_{121b}$, $T_{221b}$, and $T_{321b}$ each have second gate electrodes coupled to complementary search line $S_{12}$.

Referring to FIG. 2H, CAM memory element $T_{131}$ includes a first memory cell $T_{131a}$ including a first vertical Fe-FET coupled in parallel with a second memory cell $T_{131b}$ including a second vertical Fe-FET, both coupled between match line $ML_{11}$ and ground line $G_{11}$, CAM memory element $T_{231}$ includes a first memory cell $T_{231a}$ including a first vertical Fe-FET coupled in parallel with a second memory cell $T_{231b}$ including a second vertical Fe-FET, both coupled between match line $ML_{21}$ and ground line $G_{21}$, and CAM memory element $T_{331}$ includes a first memory cell $T_{331a}$ including a first vertical Fe-FET coupled in parallel with a second memory cell $T_{331b}$ including a second vertical Fe-FET, both coupled between match line $ML_{31}$ and ground line $G_{31}$. First memory cells $T_{131a}$, $T_{231a}$, and $T_{331a}$ each have first gate electrodes coupled to search line $S_{13}$, and second memory cells $T_{131b}$, $T_{231b}$, and $T_{331b}$ each have second gate electrodes coupled to complementary search line $\overline{S_{13}}$.

In the embodiments described above and depicted in FIGS. 2C-2H, each of CAM memory elements $T_{111}$-$T_{333}$ may be a ferroelectric memory element, and in particular may include vertical Fe-FETs that have a gate oxide including one or more of hafnium oxide and hafnium zirconium oxide. In an embodiment, the gate oxide includes hafnium oxide doped with one or more of silicon, aluminum, zirconium, yttrium, gadolinium, calcium, cerium, dysprosium, erbium, germanium, scandium, and tin.

In other embodiments, each of CAM memory elements $T_{111}$-$T_{333}$ may include any device whose threshold voltage can be programmed, such as charge storage memory elements (e.g., a transistor includes a floating gate or a charge trapping layer).

In an embodiment, CAM memory cell array 200 of FIG. 2A may be operated as follows: data are written into CAM memory cell array 200 the array are organized in words along the match lines $ML_{11}$-$ML_{32}$ and ground lines $G_{11}$-$G_{32}$.

Also, a single bit of information—the bit's value and its complement—is stored per CAM memory element $T_{111}$-$T_{333}$.

In an embodiment, a write operation includes the following steps:

In a first step, set all match lines $ML_{11}$-$ML_{32}$, ground lines $G_{11}$-$G_{32}$, and search lines $S_{11}$-$\overline{S_{13}}$ to 0V.

In a second step, bring all match lines $M_{L11}$-$ML_{32}$ and ground lines $G_{11}$-$G_{32}$ to a programming voltage $(\frac{1}{6})*VP$, where VP is between about 6V and about 8V. For example with VP=6V, all match lines $ML_{11}$-$ML_{32}$ and ground lines $G_{11}$-$G_{32}$ are brought to 1V.

In a third step, bring all search lines $S_{11}$-$\overline{S_{13}}$ to $(-\frac{1}{6})*VP$. For example, with VP=6V, all search lines $S_{11}$-$\overline{S_{13}}$ are brought to $-1V$.

In a fourth step, for the row in which data are to be stored, bring the match lines $ML_{xx}$ and ground lines $G_{xx}$ in the row to $-0.5*VP$. For example, with VP=6V, the match lines $ML_{xx}$ and ground lines $G_{xx}$ in the row are brought to $-3V$.

In a fifth step, for all CAM memory elements $T_{xxx}$ that are to be set to a 1, bring the corresponding search line $S_{xx}$ to $+0.5$ VP, and for all CAM memory elements $T_{xxx}$ that are to be set to a 0, bring the corresponding complementary search line $\overline{S_{xx}}$ to $+0.5$ VP. For example, with VP=6V, the corresponding search lines $S_{xx}$ and corresponding complementary search lines $\overline{S_{xx}}$ are brought to $+3V$.

Next, program the opposite bits. In a sixth step, bring all match lines $ML_{11}$-$ML_{32}$ and ground lines $G_{11}$-$G_{32}$ to $(-\frac{1}{6})*VP$. For example with VP=6V, all match lines $ML_{11}$-$ML_{32}$ and ground lines $G_{11}$-$G_{32}$ are brought to $-1V$.

In a seventh step, bring all search lines $S_{11}$-$\overline{S_{13}}$ to $(+\frac{1}{6})*VP$. For example, with VP=6V, all search lines $S_{11}$-$\overline{S_{13}}$ are brought to 1V.

In an eighth step, for the row in which data are to be stored, bring the match lines $ML_{xx}$ and ground lines $G_{xx}$ in the row to $+0.5*VP$. For example, with VP=6V, the match lines $ML_{xx}$ and ground lines $G_{xx}$ in the row are brought to 3V.

In a ninth step, for all CAM memory elements $T_{xxx}$ that are to be set to a 0, bring the corresponding search line $S_{xx}$ to $-0.5$ VP, and for all CAM memory elements $T_{xxx}$ that are to be set to a 1, bring the corresponding complementary search line $\overline{S_{xx}}$ to $-0.5$ VP. For example, with VP=6V, the corresponding search lines $S_{xx}$ and corresponding complementary search lines $\overline{S_{xx}}$ are brought to $-3V$.

In an embodiment, the result will be CAM memory elements $T_{xxx}$ with different threshold voltages. For example, a first threshold voltage VTH (e.g., 1.5V) will be stored to represent a logic 1, and a second threshold voltage VTL (e.g., 0.5 V) will be stored to represent a logic 0.

In an embodiment, a match operation includes the following steps:

In a first step, all ground lines $G_{11}$-$G_{32}$ are brought to 0V, and all match lines $ML_{11}$-$ML_{32}$ are pre-charged to a positive voltage, e.g., 0.5V.

In a second step, the data to be matched are presented as voltages on search/complementary search lines $S_{11}$-$\overline{S_{13}}$. For the data encoding scheme described above in the "write" step, a logic 1 in the search data would be represented by a voltage (VTH+VTL)/2 (which would be=1V in the example above), and a logic 0 would be represented by 0V. In this way, a logic 1 search (or complementary search) line paired with a CAM memory element $T_{xxx}$ having first threshold voltage VTH would not pull down the corresponding pre-charged match line. In an embodiment, a complete truth table for the Match operation is shown below:

| $S_{XX}$ | $\overline{S_{XX}}$ | $T_{XXXa}$ VT | $T_{XXXb}$ VT | $M_{XX}$ | Comment |
|---|---|---|---|---|---|
| 1 V | 0 V | 1.5 V | 0.5 V | High | Cell stored data = 1, $S_{XX}$ = 1: match |
| 1 V | 0 V | 0.5 V | 1.5 V | Low | Cell stored data = 0, $S_{XX}$ = 1: mismatch |
| 0 V | 1 V | 1.5 V | 0.5 V | Low | Cell stored data = 1, $S_{XX}$ = 0: mismatch |
| 0 V | 1 V | 0.5 V | 1.5 V | High | Cell stored data = 0, $S_{XX}$ = 0: match |
| 0 V | 0 V | (either) | (either) | High | $S_{XX}$ = "don't care" always matches |
| (either) | (either) | 1.5 V | 1.5 V | High | Cell stored data = "don't care"; always matches |

Note that this table includes three states, making this a "ternary" CAM array.

In an embodiment, match lines $ML_{11}$-$ML_{32}$ feed into sense amplifiers that detect whether or not a match line has been pulled low, and latches this result as a digital output. The digital sense amplifier outputs are fed into encoding circuits that output the address of the match line that stays high. In an embodiment, if more than one row matches, then the encoding circuit can prioritize which address is output (for example, the lowest address is output).

Figure 3A:
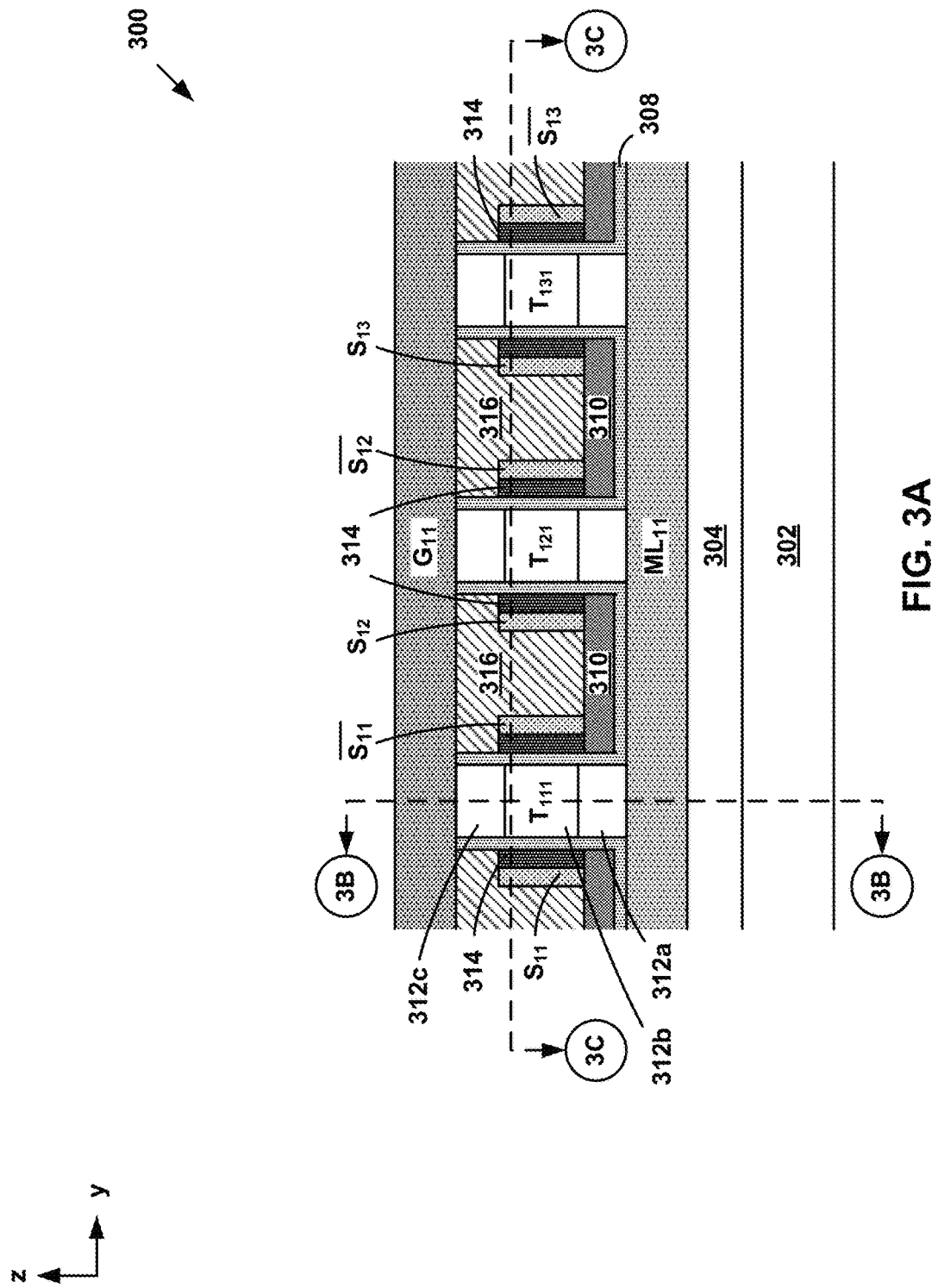
FIGS. 3A-3C depict various views of an embodiment monolithic three-dimensional memory array.
Figure 3B:
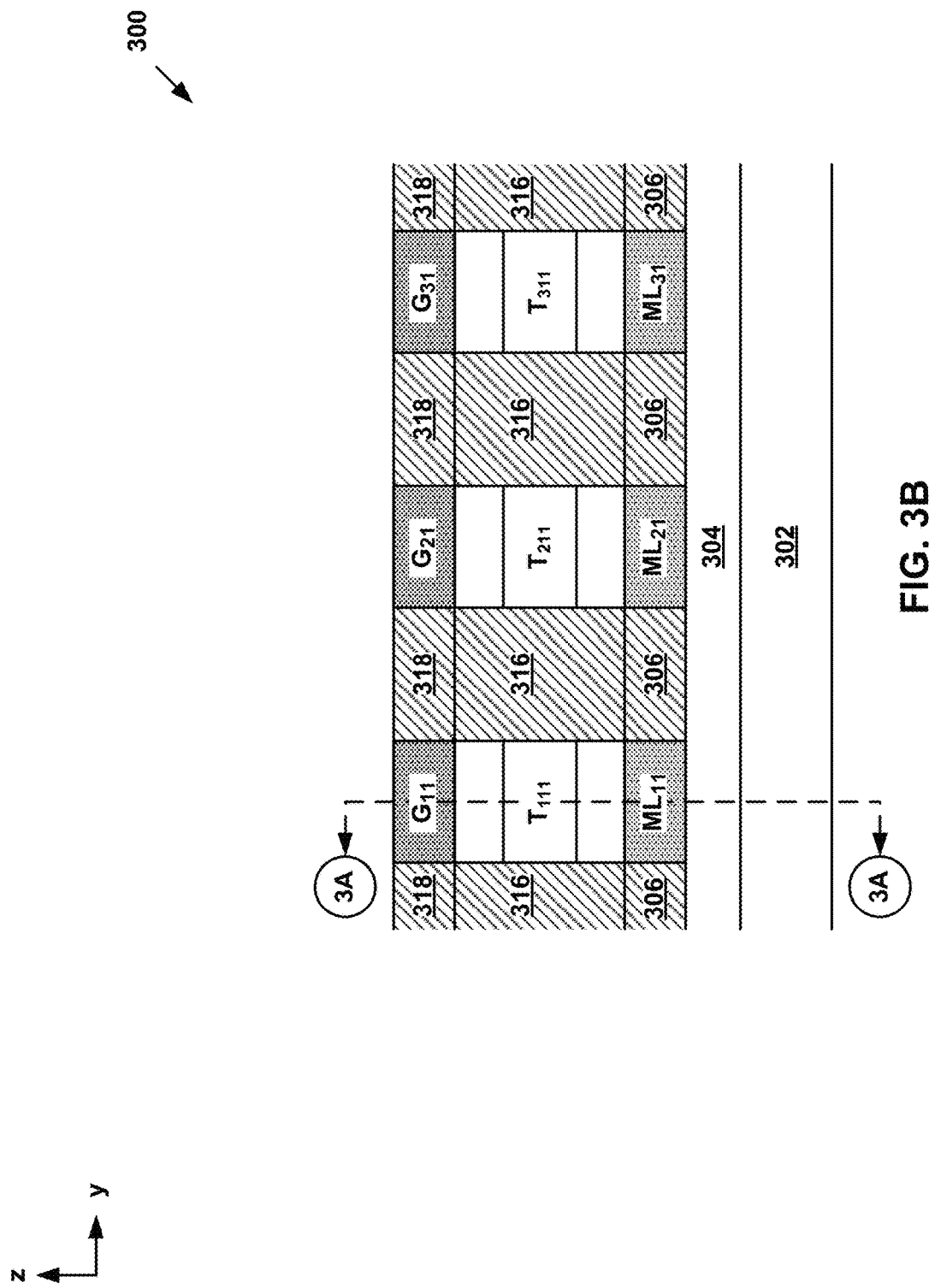
Figure 3C:
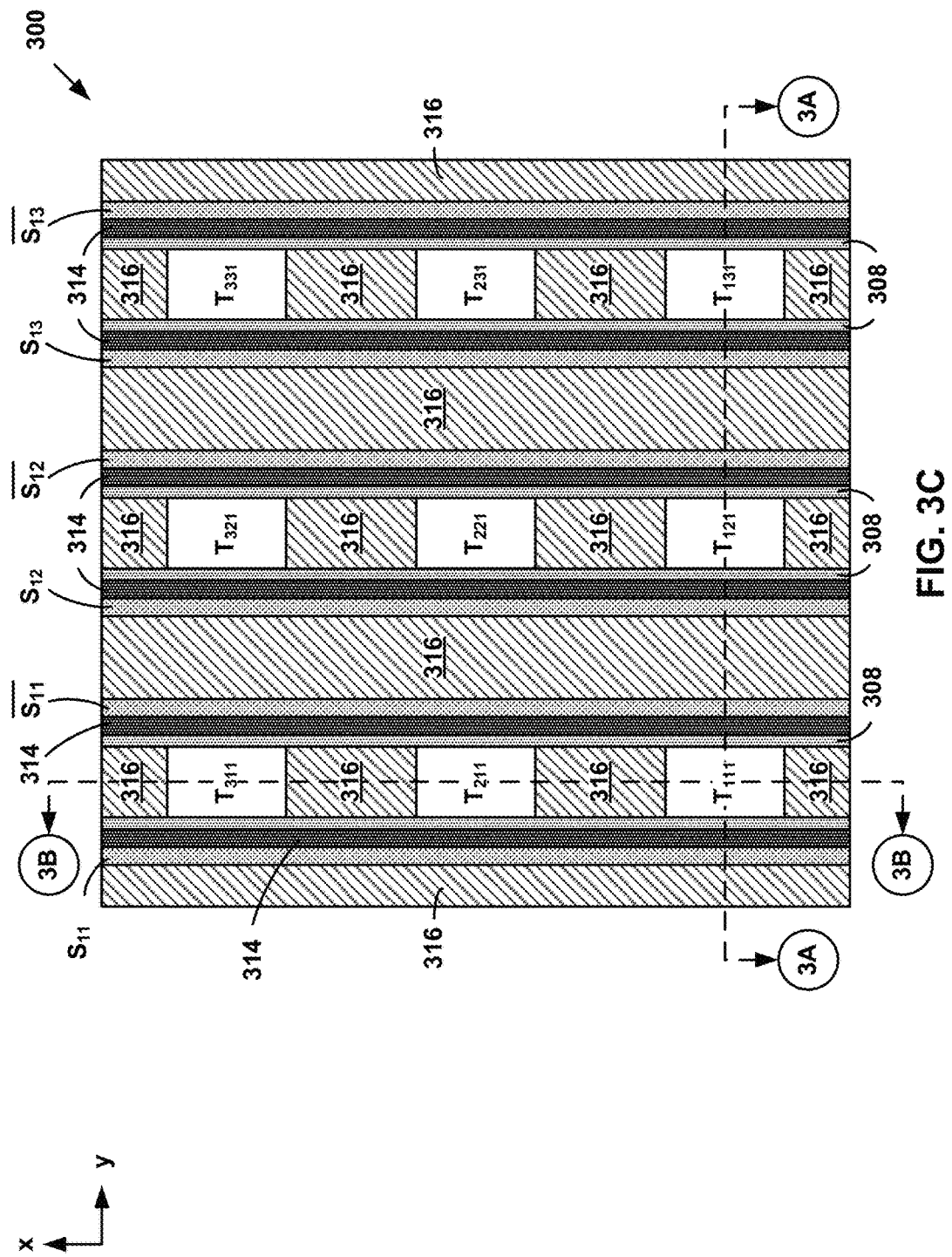
Figure 412:
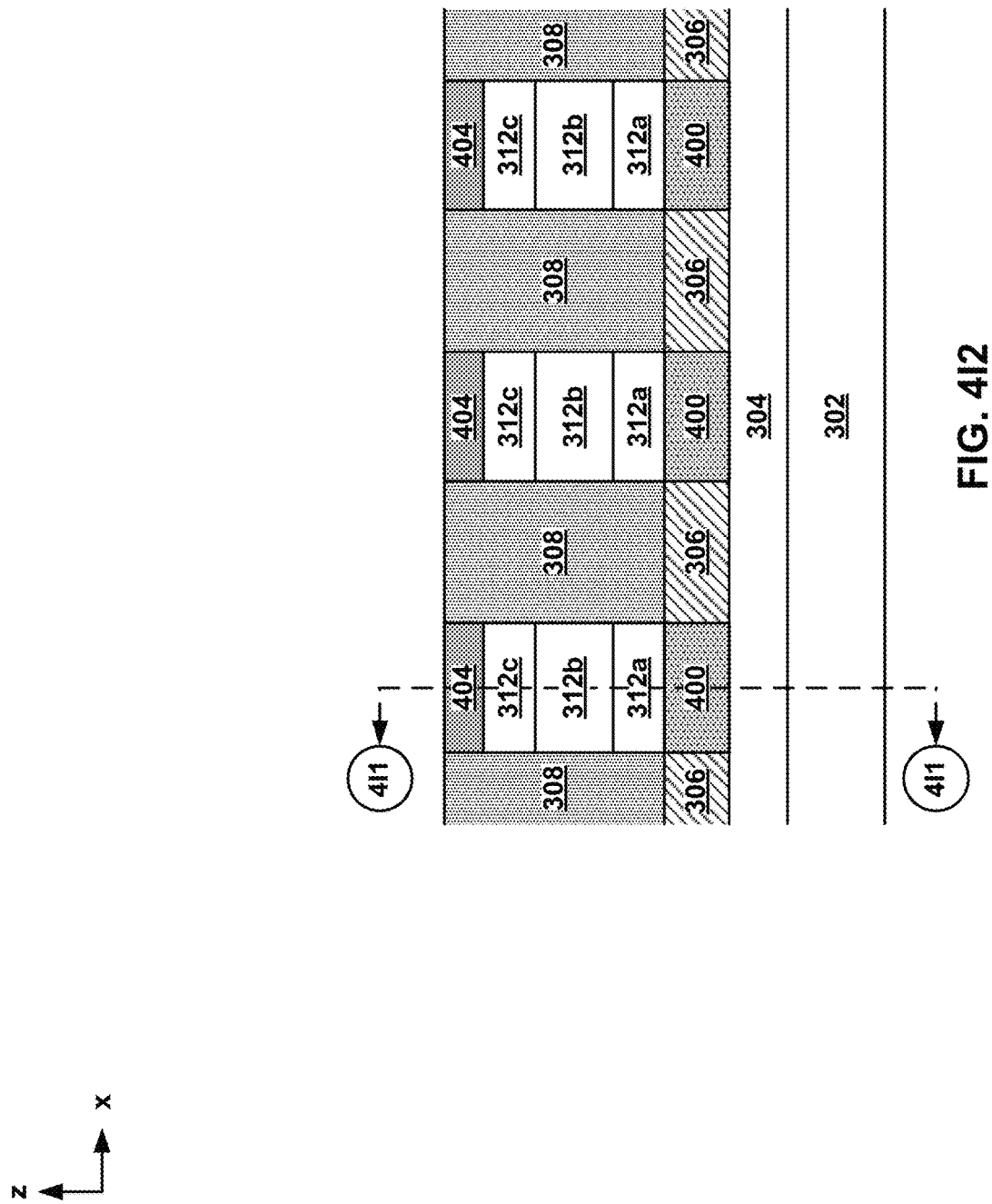
Figure 413:
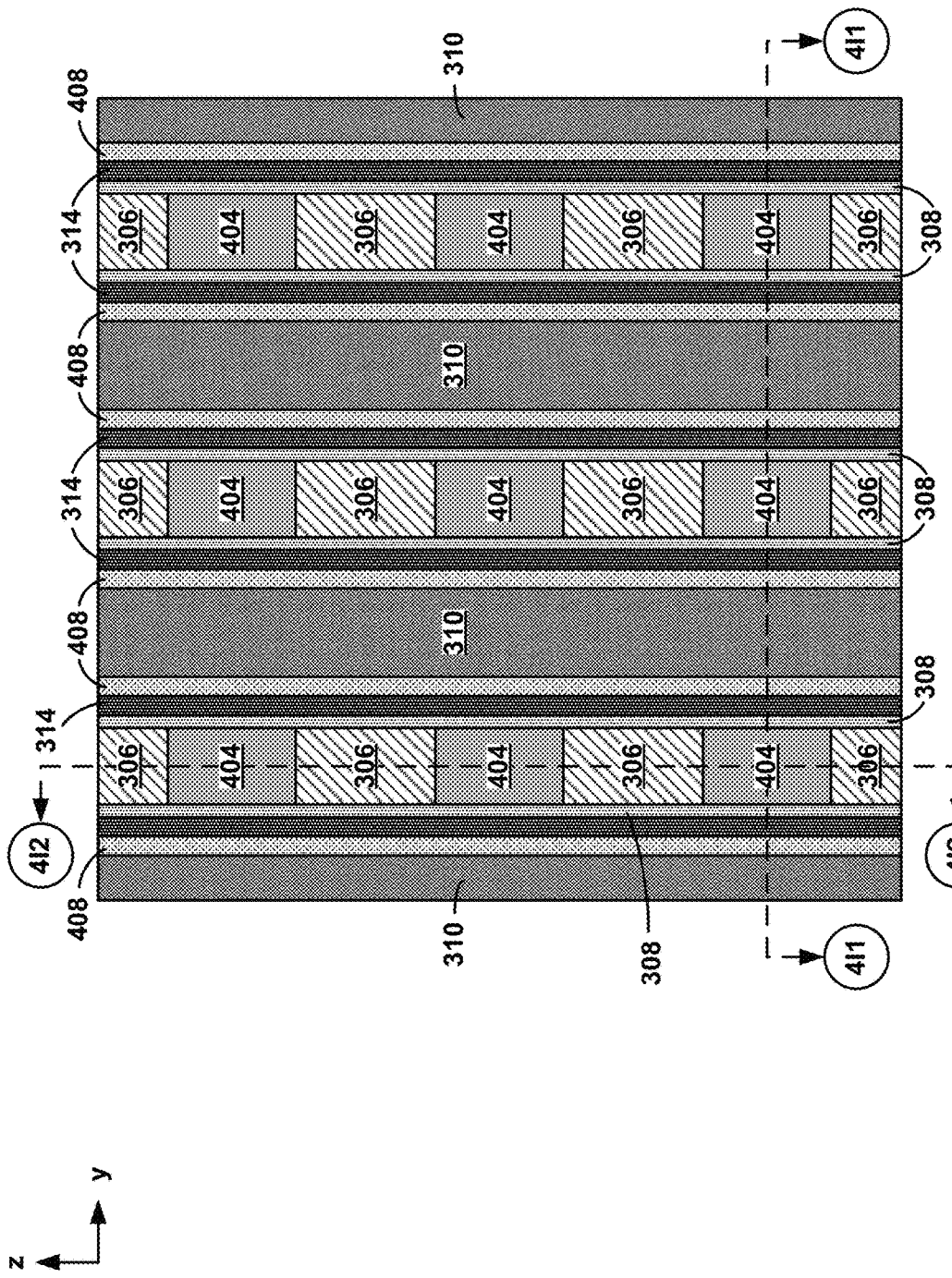

FIGS. 3A-3C depict various views of an embodiment of a portion of a monolithic three-dimensional CAM memory cell array 300 that includes vertical Fe-FETs that have a gate oxide including hafnium oxide. The physical structure depicted in FIGS. 3A-3C may include one implementation for a portion of the monolithic three-dimensional CAM memory cell array 200 depicted in FIG. 2A.

Monolithic three-dimensional CAM memory cell array 300 includes match lines $ML_{11}$-$ML_{31}$ and ground lines $G_{11}$-$G_{32}$ arranged in a first direction (e.g., an x-direction), and search lines $S_{11}$-$\overline{S_{13}}$ arranged in a second direction (e.g., a y-direction) perpendicular to the first direction. Ground lines $G_{11}$-$G_{32}$ are disposed above match lines $ML_{11}$-$ML_{31}$, and each have a long axis in the second direction (e.g., y-direction). Persons of ordinary skill in the art will understand that monolithic three-dimensional memory arrays, such as monolithic three-dimensional CAM memory cell array 300 may include more or fewer than three ground lines, three match lines, and six search lines.

In an embodiment, match lines $ML_{11}$, $ML_{21}$, $ML_{31}$ are disposed above a substrate 302, such as a silicon, germanium, silicon-germanium, undoped, doped, bulk, silicon-on-insulator ("SOI") or other substrate with or without additional circuitry. In an embodiment, an isolation layer 304, such as a layer of silicon dioxide, silicon nitride, silicon oxynitride or any other suitable insulating layer, is formed above substrate 302.

In an embodiment, a first dielectric material layer 306 (e.g., silicon dioxide) is formed above isolation layer 304. Match lines $ML_{11}$, $ML_{21}$, $ML_{31}$ are disposed above isolation layer 304 and are separated by first dielectric material layer 306. Match lines $ML_{11}$, $ML_{21}$, $ML_{31}$ are formed of a conductive material (e.g., tungsten) and may include an adhesion layer (not shown) disposed on an outer surface of each match line $ML_{11}$, $ML_{21}$, $ML_{31}$.

CAM memory elements (vertical Fe-FETs) $T_{111}$-$T_{331}$ are formed above match lines $ML_{11}$, $ML_{2i}$, $ML_{31}$, and each has a first electrode (e.g., a drain/source electrode) disposed on and coupled to one of match lines $ML_{11}$, $ML_{21}$, $ML_{31}$, a second electrode (e.g., a source/drain electrode) coupled to one of ground lines $G_{11}$-$G_{32}$, a first gate electrode coupled to one of search lines $S_{11}$, $S_{12}$, $S_{13}$, and a second gate electrode coupled to one of complementary search lines $\overline{S_{11}}$, $\overline{S_{12}}$, $\overline{S_{13}}$. For each vertical Fe-FET $T_{111}$-$T_{331}$, the first gate electrode and the second gate electrode are disposed on opposite sides of the vertical Fe-FET.

Each vertical Fe-FETs $T_{111}$-$T_{331}$ includes a vertical semiconductor pillar that includes a first region 312a (e.g., n+ polysilicon), a second region 312b (e.g., p polysilicon) and a third region 312c (e.g., n+ polysilicon) to form drain/source, body, and source/drain regions, respectively, of a vertical FET. In an embodiment, the vertical semiconductor pillar has a rectangular shape, although other pillar shapes may be used.

Search lines $S_{11}$-$\overline{S_{13}}$ are formed of a conductive material (e.g., titanium nitride) and are disposed above and separated from match lines $ML_{11}$, $ML_{21}$, $ML_{31}$ by a second dielectric 308 (e.g., SiON) and optionally also may be separated from match lines $ML_{11}$, $ML_{21}$, $ML_{31}$ by a spacer dielectric 310 (e.g., $SiO_2$). A ferroelectric gate oxide 314 (e.g., silicon-doped $HfO_2$) is disposed between search lines $S_{11}$-$\overline{S_{13}}$ and sidewalls of first region 312a, second region 312b and third region 312c of vertical Fe-FETs $T_{111}$-$T_{331}$. Second dielectric 308 may be disposed between gate oxide 314 and sidewalls of first region 312a, second region 312b and third region 312c of vertical Fe-FETs $T_{111}$-$T_{331}$.

In an embodiment, the first gate electrode and second gate electrode of vertical Fe-FETs $T_{111}$, $T_{211}$, $T_{311}$ are coupled to search lines $S_{11}$ and $\overline{S_{11}}$, respectively, the first gate electrode and second gate electrode of vertical Fe-FETs $T_{121}$, $T_{221}$, $T_{321}$ are coupled to search lines $S_{12}$ and $\overline{S_{12}}$, respectively, and the first gate electrode and second gate electrode of vertical Fe-FETs $T_{131}$, $T_{231}$, $T_{331}$ are coupled to search lines $S_{13}$ and $\overline{S_{13}}$, respectively. A third dielectric 316 (e.g., $SiO_2$) is disposed between and electrically isolates vertical Fe-FETs $T_{111}$-$T_{331}$.

Ground lines $G_{11}$-$G_{32}$ are disposed above and are coupled to third regions 312c of vertical Fe-FETs $T_{111}$-$T_{331}$, and are separated by fourth dielectric material layer 318. Ground lines $G_{11}$-$G_{32}$ are formed of a conductive material (e.g., tungsten) and may include an adhesion layer (not shown) disposed on an outer surface of each ground line $G_{11}$-$G_{32}$.

Without wanting to be bound by any particular theory, it is believed that monolithic three-dimensional CAM memory cell array 300 of FIGS. 3A-3C may be used to form a compact CAM memory cell array including vertical FeFETs. Each vertical FeFET has two gate electrodes that may be controlled separately. In addition, a stackable memory may be achieved by vertically stacking layers of monolithic three-dimensional memory arrays, such as monolithic three-dimensional CAM memory cell array 300 of FIGS. 3A-3C.

Referring now to FIGS. 4A1-4K4, an example method of forming a portion of a monolithic three-dimensional memory array, such as monolithic three-dimensional CAM memory cell array 300 of FIGS. 3A-3C, is described.

With reference to FIGS. 4A1-4A3, substrate 302 is shown as having already undergone several processing steps. Substrate 302 may be any suitable substrate such as a silicon, germanium, silicon-germanium, undoped, doped, bulk, silicon-on-insulator ("SOI") or other substrate with or without additional circuitry. For example, substrate 302 may include one or more n-well or p-well regions (not shown). Isolation layer 304 is formed above substrate 302. In some embodiments, isolation layer 304 may be a layer of silicon dioxide, silicon nitride, silicon oxynitride or any other suitable insulating layer.

Following formation of isolation layer 304, a conductive material layer 400 is deposited over isolation layer 304.

Conductive material layer 400 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive material layer 400 may be between about 20 and about 250 nm of tungsten. Other conductive material layers and/or thicknesses may be used. In some embodiments, an adhesion layer (not shown), such as titanium nitride or other similar adhesion layer material, may be disposed between isolation layer 304 and conductive material layer 400, and/or between conductive material layer 400 and subsequent material layers.

Persons of ordinary skill in the art will understand that adhesion layers may be formed by PVD or another method on conductive material layers. For example, adhesion layers may be between about 2 and about 50 nm, and in some embodiments about 10 nm, of titanium nitride or another suitable adhesion layer such as tantalum nitride, tungsten nitride, tungsten, molybdenum, combinations of one or more adhesion layers, or the like. Other adhesion layer materials and/or thicknesses may be employed.

Following formation of conductive material layer 400, conductive material layer 400 is patterned and etched. For example, conductive material layer 400 may be patterned and etched using conventional lithography techniques, with a soft or hard mask, and wet or dry etch processing. In at least one embodiment, conductive material layer 400 is patterned and etched to form match lines $ML_{11}$, $ML_{21}$, $ML_{31}$. Example widths for match lines $ML_{11}$, $ML_{21}$, $ML_{31}$ and/or spacings between match lines $ML_{11}$, $ML_{21}$, $ML_{31}$ range between about 38 nm and about 100 nm, although other conductor widths and/or spacings may be used.

After match lines $ML_{11}$, $ML_{21}$, $ML_{31}$ have been formed, a first dielectric material layer 306 is formed over substrate 302 to fill the voids between match lines $ML_{11}$, $ML_{21}$, $ML_{31}$. For example, approximately 300-700 nm of silicon dioxide may be deposited on the substrate 302 and planarized using chemical mechanical polishing or an etchback process to form a planar surface 402. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, match lines $ML_{11}$, $ML_{21}$, $ML_{31}$ may be formed using a damascene process in which first dielectric material layer 306 is formed, patterned and etched to create openings or voids for match lines $ML_{11}$, $ML_{21}$, $ML_{31}$. The openings or voids then may be filled with conductive layer 400 (and/or a conductive seed, conductive fill and/or barrier layer if needed). Conductive material layer 400 then may be planarized to form planar surface 402.

Following planarization, the semiconductor material used to form vertical Fe-FETs $T_{111}$-$T_{331}$ is formed over planarized top surface 402 of substrate 302. In some embodiments, each vertical Fe-FET is formed from a polycrystalline semiconductor material such as polysilicon, an epitaxial growth silicon, a polycrystalline silicon-germanium alloy, polygermanium or any other suitable material. Alternatively, vertical Fe-FETs $T_{111}$-$T_{331}$ may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each vertical Fe-FETs $T_{111}$-$T_{331}$. may include a first region (e.g., n+ polysilicon), a second region (e.g., p polysilicon) and a third region (e.g., n+ polysilicon) to form drain/source, body, and source/drain regions, respectively, of a vertical Fe-FET. For example, a heavily doped n+ polysilicon layer 312a may be deposited on planarized top surface 402. In some embodiments, n+ polysilicon layer 312a is in an amorphous state as deposited. In other embodiments, n+ polysilicon layer 312a is in a polycrystalline state as deposited. CVD or another suitable process may be employed to deposit n+ polysilicon layer 312a.

In an embodiment, n+ polysilicon layer 312a may be formed, for example, from about 10 to about 50 nm, of phosphorus or arsenic doped silicon having a doping concentration of about $10^{21}$ cm$^{-3}$. Other layer thicknesses, doping types and/or doping concentrations may be used. N+ polysilicon layer 312a may be doped in situ, for example, by flowing a donor gas during deposition. Other doping methods may be used (e.g., implantation).

After deposition of n+ silicon layer 312a, a doped p-type silicon layer 312b may be formed over n+ polysilicon layer 312a. P-type silicon may be either deposited and doped by ion implantation or may be doped in situ during deposition to form a p-type silicon layer 312b. For example, an intrinsic silicon layer may be deposited on n+ polysilicon layer 312a, and a blanket p-type implant may be employed to implant boron a predetermined depth within the intrinsic silicon layer. Example implantable molecular ions include $BF_2$, $BF_3$, B and the like. In some embodiments, an implant dose of about 1-10×$10^{13}$ ions/cm$^2$ may be employed. Other implant species and/or doses may be used. Further, in some embodiments, a diffusion process may be employed. In an embodiment, the resultant p-type silicon layer 312b has a thickness of from about 80 to about 400 nm, although other p-type silicon layer sizes may be used.

Following formation of p-type silicon layer 312b, a heavily doped n+ polysilicon layer 312c is deposited on p-type silicon layer 312b. In some embodiments, n+ polysilicon layer 312c is in an amorphous state as deposited. In other embodiments, n+ polysilicon layer 312c is in a polycrystalline state as deposited. CVD or another suitable process may be employed to deposit n+ polysilicon layer 312c.

In an embodiment, n+ polysilicon layer 312c may be formed, for example, from about 10 to about 50 nm of phosphorus or arsenic doped silicon having a doping concentration of about $10^{21}$ cm$^{-3}$. Other layer thicknesses, doping types and/or doping concentrations may be used. N+ polysilicon layer 312c may be doped in situ, for example, by flowing a donor gas during deposition. Other doping methods may be used (e.g., implantation). Persons of ordinary skill in the art will understand that silicon layers 312a, 312b and 312c alternatively may be doped p+/n/p+, respectively, or may be doped with a single type of dopant to produce junctionless-FETs.

Following formation of n+ polysilicon layer 312c, a hard mask material layer 404 is deposited on n+ polysilicon layer 312c, resulting in the structure shown in FIGS. 4B1-4B2. Hard mask material layer 404 may include any suitable hard mask material such as silicon nitride, amorphous carbon, or the like deposited by any suitable method (e.g., CVD, PVD, etc.). In at least one embodiment, hard mask material layer 404 may be between about 30 nm and about 80 nm of silicon nitride. Other hard mask materials and/or thicknesses may be used.

Hard mask material layer 404 and silicon layers 312a, 312b and 312c are patterned and etched to form rows 406 of silicon layers 312a, 312b and 312c and hard mask material layer 404, resulting in the structure shown in FIGS. 4C1-4C3. For example, hard mask material layer 404 and silicon layers 312a, 312b and 312c may be patterned and etched using conventional lithography techniques, with wet or dry etch processing.

Hard mask material layer 404 and silicon layers 312a, 312b and 312c may be patterned and etched in a single pattern/etch procedure or using separate pattern/etch steps. Any suitable masking and etching process may be used to form vertical transistor pillars. For example, silicon layers may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, rows 406 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.0-1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

A second dielectric material layer 308 is deposited conformally over substrate 302, and forms on sidewalls of rows 406, resulting in the structure shown in FIGS. 4D1-4D2. For example, between about 0.5 nm to about 10 nm of silicon oxynitride may be deposited. Other dielectric materials such as silicon dioxide or other dielectric materials and/or dielectric material layer thicknesses may be used.

An optional spacer dielectric material 310 may be deposited anisotropically over substrate 302, filling voids between on rows 406. For example, between approximately 20 nm to about 90 nm of silicon dioxide may be deposited on top of second dielectric material layer 308 on rows 406, and between approximately 10 nm to about 90 nm of silicon dioxide may be deposited on bottom of trenches of second dielectric material layer 308 between rows 406, resulting in the structure shown in FIGS. 4E1-4E2. Other dielectric materials, thicknesses and deposition techniques may be used.

Spacer dielectric material 310 is then isotropically etched, for example by a wet etch process, removing spacer dielectric material layer 310 from tops and sidewalls of second dielectric material layer 308, and leaving between about 10 nm and about 70 nm of spacer dielectric material 310 on bottom of trenches of second dielectric material layer 308 between rows 406, resulting in the structure shown in FIGS. 4F1-4F2. Alternatively, a chemical dry etching (CDE) process can be used to isotropically etch spacer dielectric material 310. Other etch chemistries may be used.

A gate oxide material 314 is deposited conformally (e.g., by atomic layer deposition (ALD)) over substrate 302, and forms on sidewalls second dielectric material layer 308. In an embodiment, gate oxide material 314 includes a ferroelectric oxide material. For example, between about 5 nm to about 20 nm of hafnium oxide may be deposited. The gate oxide may be doped with, for example, one or more of silicon, aluminum, zirconium, yttrium, gadolinium, calcium, cerium, dysprosium, erbium, germanium, scandium, and tin during the deposition step. In embodiment, the doping can be performed by using a precursor containing the dopant during the ALD step. In an embodiment, the ALD step includes depositing alternating thin layers of $HfO_2$ and $SiO_2$, with the relative thickness of each layer determining the amount of the silicon dopant incorporated into the final deposited film. Other oxide materials, dopants and/or thicknesses may be used. In an embodiment, annealing may be performed to crystallize the deposited gate oxide material. An anisotropic etch is used to remove lateral portions of gate oxide material, leaving only sidewall portions of gate oxide material 314, resulting in the structure shown in FIGS. 4G1-4G2.

A gate electrode material is deposited over substrate 302. For example, approximately 5 nm to about 30 nm of titanium nitride, or other similar conductive material may be deposited. Other conductive materials and/or thicknesses may be used. The as-deposited gate electrode material is subsequently etched back to form gate electrodes 408, resulting in the structure shown in FIGS. 4H1-4H2. Gate electrodes 408 are disposed on opposite sides of the vertical stack of silicon layers 312a, 312b and 312c. Other conductive materials and/or thicknesses may be used for gate electrodes 408. Gate electrodes 408 will be used to form search lines $S_{11}$-$\overline{S_{33}}$.

An anisotropic etch is used to remove lateral portions of second dielectric material layer 308, leaving only sidewall portions of second dielectric material layer 308. Next, hard mask material layer 404 and silicon layers 312a, 312b and 312c are patterned and etched to form vertical transistor pillars, resulting in the structure shown in FIGS. 4I1-4I3. For example, hard mask material layer 404 and silicon layers 312a, 312b and 312c may be patterned and etched using conventional lithography techniques, with wet or dry etch processing. In an embodiment, hard mask material layer 404 and silicon layers 312a, 312b and 312c are patterned and etched to form vertical transistor pillars disposed above match lines $ML_{11}$, $ML_{21}$, $ML_{31}$. The vertical transistor pillars will be used to form vertical FeFETs $T_{111}$-$T_{331}$.

A third dielectric material layer 316 is deposited over substrate 302, filling voids between the vertical transistor pillars, gate electrodes 408, and second dielectric material layer 308. For example, approximately 5000 to about 8000 angstroms of silicon dioxide may be deposited and planarized using chemical mechanical polishing or an etch-back process to form planar top surface 410, resulting in the structure shown in FIGS. 4J1-4J3.

A conductive material layer 412 is deposited over planar surface 410. Conductive material layer 412 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive material layer 412 may be between about 20 nm and about 250 nm of tungsten. Other conductive material layers and/or thicknesses may be used. In some embodiments, an adhesion layer (not shown), such as titanium nitride or other similar adhesion layer material, may be disposed between third regions 312c and conductive material layer 412, and/or between conductive material layer 412 and subsequent material layers.

Persons of ordinary skill in the art will understand that adhesion layers may be formed by PVD or another method on conductive material layers. For example, adhesion layers may be between about 2 nm and about 50 nm, and in some embodiments about 10 nm, of titanium nitride or another suitable adhesion layer such as tantalum nitride, tungsten nitride, tungsten, molybdenum, combinations of one or more adhesion layers, or the like. Other adhesion layer materials and/or thicknesses may be employed.

Following formation of conductive material layer 412, conductive material layer 412 is patterned and etched. For example, conductive material layer 412 may be patterned and etched using conventional lithography techniques, with a soft or hard mask, and wet or dry etch processing. In at least one embodiment, conductive material layer 412 is patterned and etched to form ground lines $G_{11}$-$G_{32}$. In an embodiment, ground lines $G_{11}$-$G_{32}$ are substantially parallel to and aligned with match lines $ML_{11}$, $ML_{21}$, $ML_{31}$. In other embodiments, ground lines $G_{11}$-$G_{32}$ may be perpendicular to match lines $ML_{11}$, $ML_{21}$, $ML_{31}$. Example widths for ground lines $G_{11}$-$G_{32}$ and/or spacings between ground lines $G_{11}$-$G_{32}$ range between about 38 nm to about 100 nm, although other conductor widths and/or spacings may be used.

After ground lines $G_{11}$-$G_{32}$ have been formed, a fourth dielectric material layer 318 is formed over substrate 302 to fill the voids between ground lines $G_{11}$-$G_{32}$. For example, approximately 300-700 nm of silicon dioxide may be deposited on the substrate 302 and planarized using chemical mechanical polishing or an etchback process to form a planar surface 414. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, ground lines $G_{11}$-$G_{32}$ may be formed using a damascene process in which fourth dielectric material layer 318 is formed, patterned and etched to create openings or voids for ground lines $G_{11}$-$G_{32}$. The openings or voids then may be filled with conductive layer 412 (and/or a conductive seed, conductive fill and/or barrier layer if needed). Conductive material layer 412 then may be planarized to form planar surface 414.

Thus, as described above, one embodiment includes a content addressable memory element that includes a vertical transistor including a first electrode coupled to a match line, a second electrode coupled to a ground line, a first gate electrode coupled to a search line, and a second gate electrode coupled to a complementary search line. The first gate electrode and the second gate electrode are disposed on opposite sides of the vertical transistor, and the vertical transistor includes a charge storage memory element.

One embodiment includes a content addressable memory cell array that includes a plurality of match lines disposed in parallel along a first axis, a plurality of ground lines disposed in parallel along the first axis, a plurality of search lines disposed in parallel substantially perpendicular to the first axis, and a plurality of content addressable memory elements. Each content addressable memory element includes a vertical transistor disposed between a corresponding one of the match lines and a corresponding one of the ground lines, and each coupled to a corresponding one of the search lines. Each the content addressable memory element includes the vertical transistor and no other circuit elements.

One embodiment includes a monolithic three-dimensional content addressable memory cell array including a first memory level disposed above a substrate, and a second memory level disposed above the first memory level. The first memory level includes a plurality of first match lines disposed in parallel along a first axis, a plurality of first ground lines disposed in parallel along the first axis and above the plurality of first match lines, a plurality of first search lines disposed in parallel substantially perpendicular to the first axis, and a plurality of first content addressable memory elements, each first content addressable memory element including a vertical transistor disposed between a corresponding one of the first match lines and a corresponding one of the first ground lines, and each coupled to a corresponding one of the first search lines. The second memory level includes a plurality of second match lines disposed in parallel along the first axis and above the plurality of first ground lines, a plurality of second search lines disposed in parallel substantially perpendicular to the first axis, and a plurality of second content addressable memory elements, each second content addressable memory element including a vertical transistor disposed between a corresponding one of the second match lines and a corresponding one of the first ground lines, and each coupled to a corresponding one of the second search lines. Each of the first content addressable memory elements and each of the second content addressable memory elements includes the vertical transistor and no other circuit elements.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

The invention claimed is:

1. A content addressable memory element comprising:
a vertical transistor comprising a first electrode coupled to a match line, a second electrode coupled to a ground line, a first gate electrode coupled to a search line, and a second gate electrode coupled to a complementary search line,
wherein the first gate electrode and the second gate electrode are disposed on opposite sides of the vertical transistor; and
the vertical transistor comprises a charge storage memory element.

2. The content addressable memory element of claim 1, wherein the vertical transistor comprises a floating gate or a charge trapping layer.

3. The content addressable memory element of claim 1, wherein the content addressable memory element comprises the vertical transistor and no other circuit elements.

4. The content addressable memory element of claim 1, wherein the vertical transistor comprises a field effect transistor.

5. The content addressable memory element of claim 1, wherein the vertical transistor comprises a first region having a first conductivity type, a second region having a second conductivity type above the first region, and a third region having the first conductivity type above the second region.

6. The content addressable memory element of claim 1, wherein the first gate electrode is configured to selectively induce a first conductive channel between the first electrode and the second electrode of the vertical transistor, and the second gate electrode is configured to selectively induce a second conductive channel between the first electrode and the second electrode of the vertical transistor.

7. The content addressable memory element of claim 1, wherein the first gate electrode is configured to set a first threshold voltage of a first portion of the vertical transistor, and the second gate electrode is configured to set a second threshold voltage of a second portion of the vertical transistor.

8. The content addressable memory element of claim 1, wherein search line is configured to individually set a first threshold voltage of a first portion of the vertical transistor, and the complementary search line is configured to individually set a second threshold voltage of a second portion of the vertical transistor.

9. A content addressable memory cell array comprising:
   a plurality of match lines disposed in parallel along a first axis;
   a plurality of ground lines disposed in parallel along the first axis;
   a plurality of search lines disposed in parallel substantially perpendicular to the first axis; and
   a plurality of content addressable memory elements, each content addressable memory element comprising a vertical transistor disposed between a corresponding one of the match lines and a corresponding one of the ground lines, and each coupled to a corresponding one of the search lines,
   wherein each content addressable memory element comprises the vertical transistor and no other circuit elements.

10. The content addressable memory cell array of claim 9, wherein each of the ground lines are disposed above the match lines, and the vertical transistors are disposed above the match lines.

11. The content addressable memory cell array of claim 9, wherein each of the match lines are disposed above the ground lines, and the vertical transistors are disposed above the ground lines.

12. The content addressable memory cell array of claim 9, wherein each vertical transistor comprises a vertical field effect transistor.

13. The content addressable memory cell array of claim 9, wherein each vertical transistor comprises a charge storage memory element.

14. The content addressable memory cell array of claim 9, wherein each vertical transistor comprises a gate oxide including hafnium oxide.

15. The content addressable memory cell array of claim 9, wherein each vertical transistor comprises a first gate electrode and a second gate electrode.

16. The content addressable memory cell array of claim 15, wherein the first gate electrode and a second gate electrode are disposed on opposite sides of the vertical transistor.

17. The content addressable memory cell array of claim 9, wherein each vertical transistor comprises a floating gate or a charge trapping layer.

18. The content addressable memory cell array of claim 9, wherein each content addressable memory element comprises two memory cells.

19. A monolithic three-dimensional content addressable memory cell array comprising:
   a first memory level disposed above a substrate, the first memory level comprising:
      a plurality of first match lines disposed in parallel along a first axis;
      a plurality of first ground lines disposed in parallel along the first axis and above the plurality of first match lines;
      a plurality of first search lines disposed in parallel substantially perpendicular to the first axis; and
      a plurality of first content addressable memory elements, each first content addressable memory element comprising a vertical transistor disposed between a corresponding one of the first match lines and a corresponding one of the first ground lines, and each coupled to a corresponding one of the first search lines; and
   a second memory level disposed above the first memory level, the second memory level comprising:
      a plurality of second match lines disposed in parallel along the first axis and above the plurality of first ground lines;
      a plurality of second search lines disposed in parallel substantially perpendicular to the first axis; and
      a plurality of second content addressable memory elements, each second content addressable memory element comprising a vertical transistor disposed between a corresponding one of the second match lines and a corresponding one of the first ground lines, and each coupled to a corresponding one of the second search lines,
   wherein each of the first content addressable memory elements and each of the second content addressable memory elements comprises the vertical transistor and no other circuit elements.

20. The monolithic three-dimensional content addressable memory cell array of claim 19, wherein each of the vertical transistors comprises a charge storage memory element.

* * * * *